US011144680B2

(12) United States Patent
Jovanovic

(10) Patent No.: US 11,144,680 B2
(45) Date of Patent: Oct. 12, 2021

(54) METHODS FOR DETERMINING ENVIRONMENTAL PARAMETER DATA OF A REAL OBJECT IN AN IMAGE

(71) Applicant: Atheer, Inc., Santa Clara, CA (US)

(72) Inventor: Milos Jovanovic, Portland, OR (US)

(73) Assignee: Atheer, Inc., Santa Clara, CA (US)

(*) Notice: Subject to any disclaimer, the term of this patent is extended or adjusted under 35 U.S.C. 154(b) by 0 days.

(21) Appl. No.: 16/862,796

(22) Filed: Apr. 30, 2020

(65) Prior Publication Data

US 2020/0257830 A1    Aug. 13, 2020

Related U.S. Application Data

(63) Continuation of application No. 15/948,901, filed on Apr. 9, 2018, now Pat. No. 10,678,960, which is a (Continued)

(51) Int. Cl.
*G06F 30/00* (2020.01)
*G06F 30/13* (2020.01)
(Continued)

(52) U.S. Cl.
CPC ............ *G06F 30/00* (2020.01); *G06F 3/0486* (2013.01); *G06F 3/0488* (2013.01);
(Continued)

(58) Field of Classification Search
CPC ...... G06F 30/00; G06F 30/13; G06F 3/04815; G06F 3/04845; G06F 3/0486; G06F 3/0488; G06F 2203/04802; G06T 13/205; G06T 15/10; G06T 15/20; G06T 19/006; G06T 19/20; G06T 2215/12; G06T 2215/16; G06T 2219/004; G06T 2219/008; G06T 2219/012; G06T 2219/2004;
(Continued)

(56) References Cited

U.S. PATENT DOCUMENTS 6,532,021 B1   3/2003   Tognazzini et al.
6,771,276 B1   8/2004   Highsmith et al.
(Continued)

FOREIGN PATENT DOCUMENTS

WO    WO-2007133209 A1 * 11/2007    ............ G09B 19/00

OTHER PUBLICATIONS

Horry, Y. et al., "Tour Into the Picture: Using a Spidery Mesh Interface to Make Animation from a Single Image," Proceedings of the 24th Annual Conference on Computer Graphics and Interactive Techniques (SIGGRAPH '97), Aug. 3, 1997, Los Angeles, California, 9 pages.

*Primary Examiner* — Maurice L. McDowell, Jr.
(74) *Attorney, Agent, or Firm* — Miller IP Law, LLC

(57) ABSTRACT

Example systems and methods for virtual visualization of a three-dimensional (3D) model of an object in a two-dimensional (2D) environment. The method may include capturing the 2D environment and adding scale and perspective to the 2D environment. Further, a user may select intersection points on a ground plane of the 2D environment to form walls, thereby converting the 2D environment into a 3D space. The user may further add 3D models of objects on the wall plane such that the objects may remain flush with the wall plane.

19 Claims, 12 Drawing Sheets

Related U.S. Application Data continuation of application No. 14/710,557, filed on May 12, 2015, now Pat. No. 9,996,636.

(60) Provisional application No. 61/992,759, filed on May 13, 2014, provisional application No. 61/992,629, filed on May 13, 2014, provisional application No. 61/992,719, filed on May 13, 2014, provisional application No. 61/992,774, filed on May 13, 2014, provisional application No. 61/992,746, filed on May 13, 2014, provisional application No. 61/992,665, filed on May 13, 2014.

(51) Int. Cl.
| | | |
|---|---|---|
| *G06F 3/0481* | (2013.01) | |
| *G06F 3/0484* | (2013.01) | |
| *G06F 3/0486* | (2013.01) | |
| *G06F 3/0488* | (2013.01) | |
| *G06T 13/20* | (2011.01) | |
| *G06T 15/10* | (2011.01) | |
| *G06T 15/20* | (2011.01) | |
| *G06T 19/00* | (2011.01) | |
| *G06T 19/20* | (2011.01) | |

(52) U.S. Cl.
CPC ...... *G06F 3/04815* (2013.01); *G06F 3/04845* (2013.01); *G06F 30/13* (2020.01); *G06T 13/205* (2013.01); *G06T 15/10* (2013.01); *G06T 15/20* (2013.01); *G06T 19/006* (2013.01); *G06T 19/20* (2013.01); *G06F 2203/04802* (2013.01); *G06T 2215/12* (2013.01); *G06T 2215/16* (2013.01); *G06T 2219/004* (2013.01); *G06T 2219/008* (2013.01); *G06T 2219/012* (2013.01); *G06T 2219/2004* (2013.01); *G06T 2219/2008* (2013.01); *G06T 2219/2012* (2013.01); *G06T 2219/2016* (2013.01); *G06T 2219/2024* (2013.01)

(58) Field of Classification Search
CPC ..... G06T 2219/2008; G06T 2219/2012; G06T 2219/2016; G06T 2219/2024
See application file for complete search history.

(56) References Cited

U.S. PATENT DOCUMENTS

| | | |
|---|---|---|
| 6,809,745 B1 | 10/2004 | O'Donnell et al. |
| 6,891,533 B1 | 5/2005 | Alcorn et al. |
| 6,912,293 B1 | 6/2005 | Korobkin |
| 7,062,722 B1 | 6/2006 | Carlin et al. |
| 7,277,572 B2 | 10/2007 | MacInnes et al. |
| 7,425,958 B2 | 9/2008 | Berger et al. |
| 7,523,411 B2 | 4/2009 | Carlin |
| 8,099,237 B2 | 1/2012 | Mays et al. |
| 8,422,825 B1 | 4/2013 | Neophytou et al. |
| 8,935,328 B2 | 1/2015 | Tumuluri |
| 9,317,962 B2 | 4/2016 | Morato et al. |
| 9,659,406 B2 | 5/2017 | Arcas et al. |
| 9,996,636 B2 | 6/2018 | Jovanovic |
| 2004/0105573 A1 | 6/2004 | Neumann et al. |
| 2005/0002662 A1 | 1/2005 | Arpa et al. |
| 2007/0098290 A1 | 5/2007 | Wells |
| 2008/0222503 A1 | 9/2008 | Sandige et al. |
| 2009/0125801 A1 | 5/2009 | Algreatly |
| 2010/0001992 A1 | 1/2010 | Schultz et al. |
| 2010/0194863 A1 | 8/2010 | Lopes et al. |
| 2010/0208033 A1 | 8/2010 | Edge et al. |
| 2010/0208057 A1 | 8/2010 | Meier et al. |
| 2010/0289817 A1 | 11/2010 | Meier et al. |
| 2012/0070101 A1 | 3/2012 | Kogan et al. |
| 2012/0105581 A1 | 5/2012 | Berestov et al. |
| 2012/0116728 A1* | 5/2012 | Shear ................... G06T 19/006 703/1 |
| 2012/0169847 A1 | 7/2012 | Lee et al. |
| 2012/0183204 A1 | 7/2012 | Aarts et al. |
| 2012/0229508 A1* | 9/2012 | Wigdor .................. H04N 5/262 345/633 |
| 2013/0002649 A1 | 1/2013 | Wu et al. |
| 2013/0141428 A1 | 6/2013 | Gipson |
| 2013/0187905 A1 | 7/2013 | Vaddadi et al. |
| 2014/0019882 A1 | 1/2014 | Chew et al. |
| 2014/0132629 A1* | 5/2014 | Pandey .............. G02B 27/0172 345/633 |
| 2014/0156049 A1 | 6/2014 | Walker, Jr. |
| 2015/0062125 A1 | 3/2015 | Aguilera Perez et al. |
| 2015/0170260 A1 | 6/2015 | Lees et al. |
| 2015/0332504 A1 | 11/2015 | Wang et al. |
| 2015/0332505 A1 | 11/2015 | Wang et al. |
| 2016/0292927 A1 | 10/2016 | Finn et al. |
| 2016/0307374 A1 | 10/2016 | Kurz et al. |

* cited by examiner

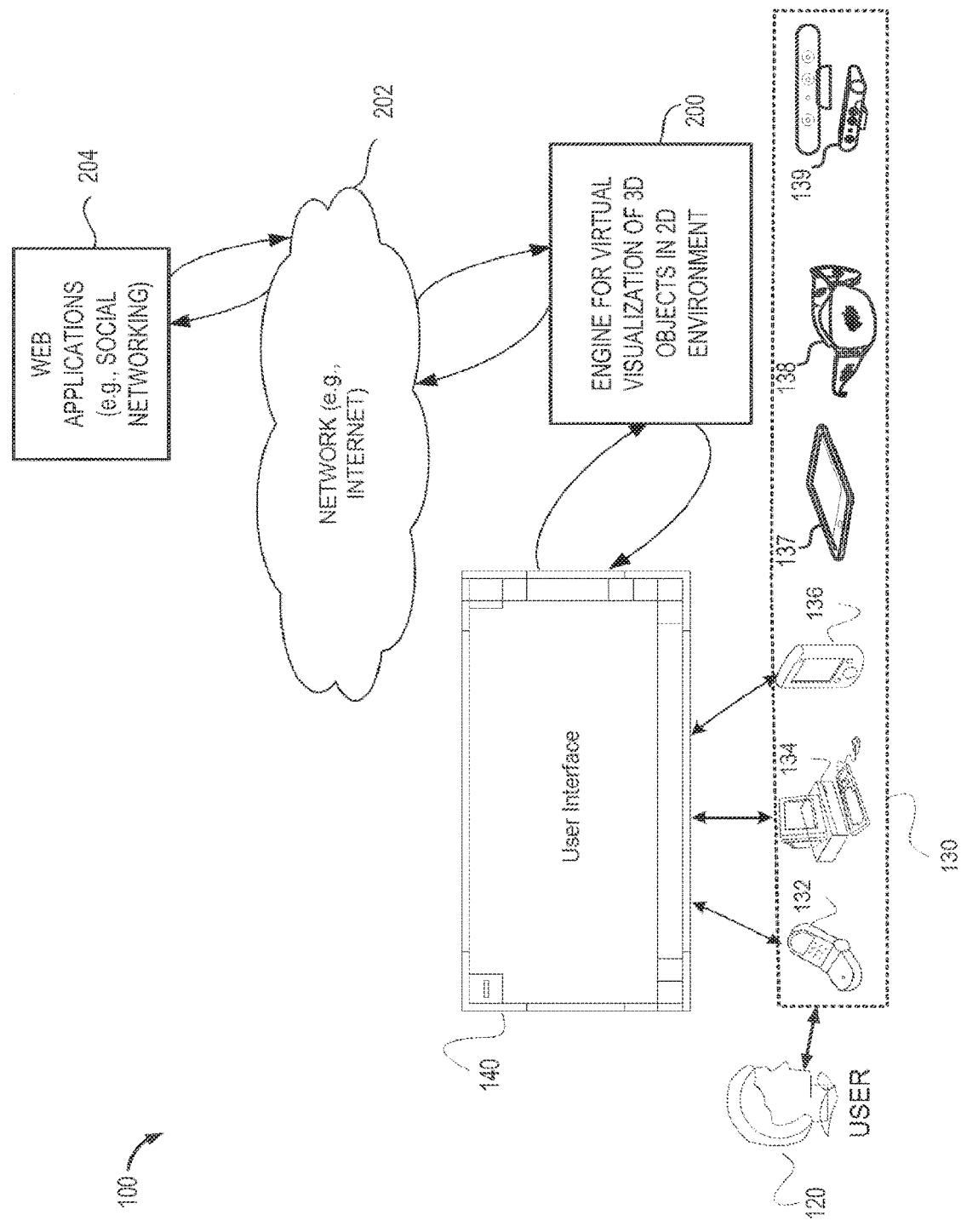

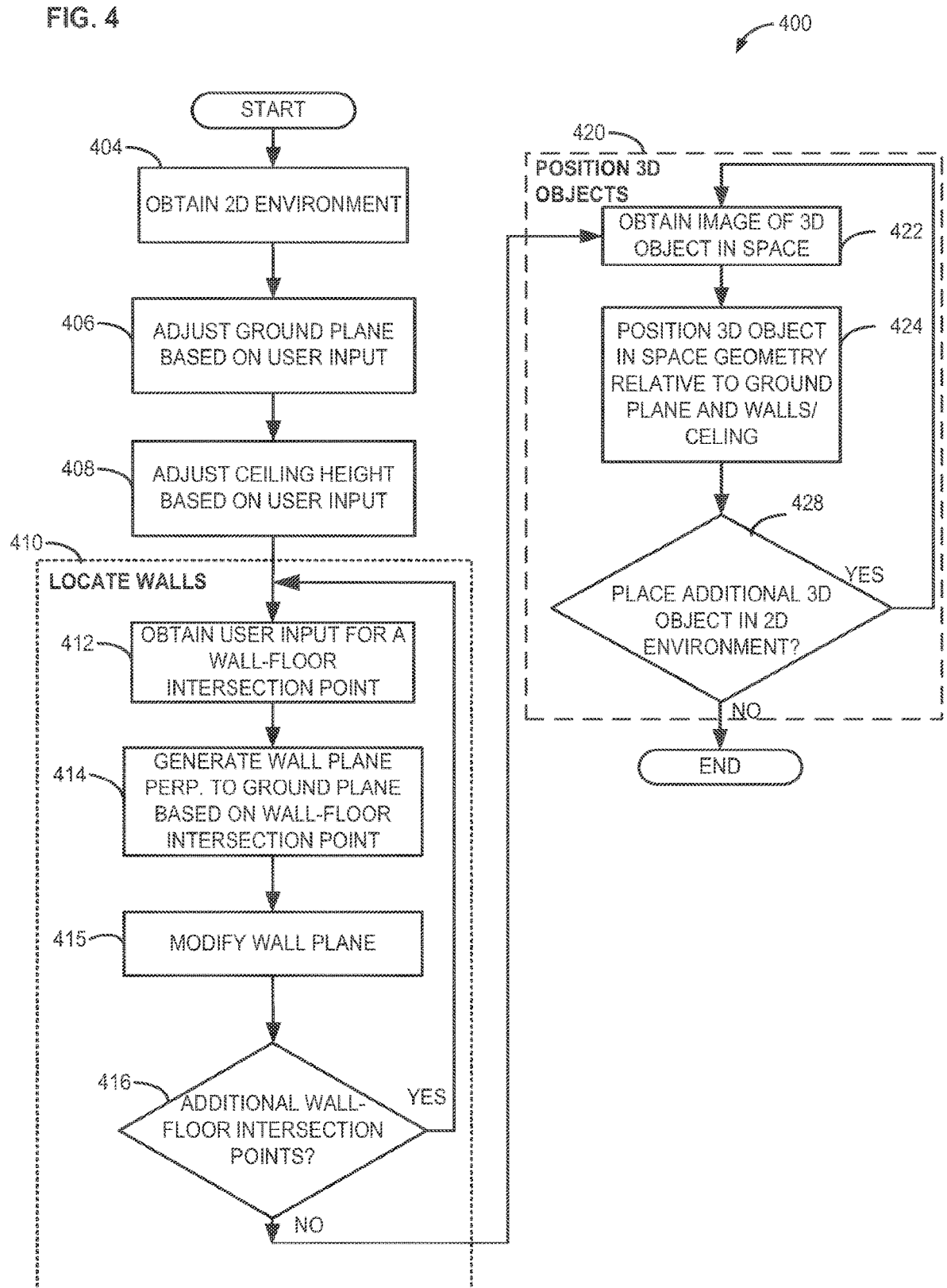

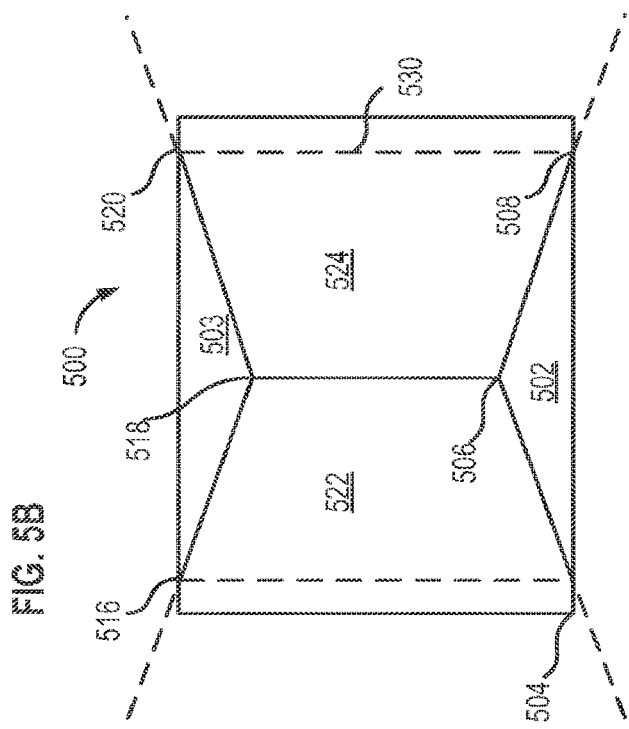
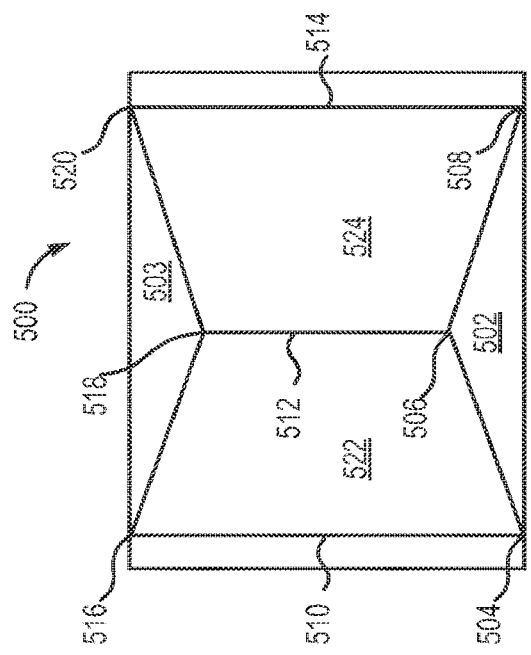

METHODS FOR DETERMINING ENVIRONMENTAL PARAMETER DATA OF A REAL OBJECT IN AN IMAGE

CROSS-REFERENCE TO RELATED APPLICATIONS

The present application is a continuation of U.S. patent application Ser. No. 15/948,901 entitled "Method for Forming Walls to Align 3D Objects in 2D Environment" filed on Apr. 9, 2018, which is a continuation of U.S. patent application Ser. No. 14/710,557 entitled "Method for Forming Walls to Align 3D Objects in 2D Environment" filed on May 12, 2015. U.S. patent application Ser. No. 14/710,557 claims priority to U.S. Provisional Patent Application No. 61/992,759 entitled "METHOD FOR FORMING WALLS TO ALIGN 3D OBJECTS IN 2D ENVIRONMENT", filed on May 13, 2014. U.S. patent application Ser. No. 14/710,557 also claims priority to U.S. Provisional Patent Application No. 61/992,629 entitled "METHOD FOR PROVIDING SCALE TO ALIGN 3D OBJECTS IN 2D ENVIRONMENT", filed on May 13, 2014. U.S. patent application Ser. No. 14/710,557 claims further priority to U.S. Provisional Patent Application No. 61/992,719 entitled "METHOD FOR PROVIDING A PROJECTION TO ALIGN 3D OBJECTS IN 2D ENVIRONMENT", filed May 13, 2014. U.S. patent application Ser. No. 14/710,557 claims further priority to U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014. U.S. patent application Ser. No. 14/710,557 claims further priority to U.S. Provisional Patent Application No. 61/992,746 entitled "METHOD FOR REPLACING 3D OBJECTS IN 2D ENVIRONMENT", filed May 13, 2014. U.S. patent application Ser. No. 14/710,557 claims further priority to U.S. Provisional Patent Application No. 61/992,665 entitled "METHOD FOR INTERACTIVE CATALOG FOR 3D OBJECTS WITHIN THE 2D ENVIRONMENT", filed May 13, 2014. The entire contents of each of the above-listed applications are hereby incorporated by reference for all purposes.

BACKGROUND AND SUMMARY

Interior design may involve developing and evaluating a design for a room or environment. For example, a designer may wish to position various objects, including furniture, lighting fixtures, and wall hangings, within a two-dimensional (2D) environment of an interior room. Conventional interior design tools may enable a user to position a three-dimensional (3D) model of an object by selecting the object, and "dragging and dropping" the object to a location in the 2D environment using a mouse, keyboard or other input device.

The inventors herein have recognized various issues with the above methods. Namely, although 3D objects may be positioned independently within the 2D environment, it may be difficult to precisely align the 3D object relative to other objects already present in the 2D environment and the different planes of the 2D environment.

One approach that at least partially address the above issues may include a method for placing a 3D object in the 2D environment, comprising, receiving an image of the 2D environment, receiving an image of the 3D object, determining the scale and perspective for the 2D environment for placing the 3D object in the 2D environment and positioning the 3D object in the 2D environment based on the calculated position.

Another example embodiment may include a method of placing the 3D object in the 2D environment, comprising, capturing the 2D environment with a mobile device, calculating perspective and scale based on a perspective plane or wall drawn for the different planes (wall plane, ground plane, top plane and so forth) of the 2D environment and positioning the 3D model of the object in the 2D environment based on the calculated object position. A user may use one or more mobile device sensors to automate the level of the different planes. The user may need to add the lower corners to calculate the geometry of the 2D environment. Further, a user may select intersection points between wall planes and ground planes, join these intersecting points with intersecting lines and form walls, thereby converting the 2D environment into a 3D space. Additionally, the method allows the user to extend the wall plane, enabling the user to form a larger 3D space. In further embodiments, the method herein may allow the user to add 3D models of objects which may be configured to remain flush with the wall plane.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

FIG. 1A is a block diagram illustrating the overall system for visualization of 3D models of objects in a 2D environment, in accordance with various embodiments.

FIG. 4 is an example flowchart for a method of placing an object in the 2D environment with additional scale and perspective.

FIGS. 5A and 5B are examples of enhanced wall tagging.

DETAILED DESCRIPTION

The present description relates to visualization and adding of 3D objects to a real environment represented by a 2D photo or video. A user may import photographic images, digital images, live video streams, and other graphical representations of a 2D environment. The user may then insert a 3D object into the 2D environment with respect to the scale and perspective of the 2D environment. The user may select intersection points between different planes within the 2D environment. The different planes may include wall plane, ground plane (e.g., the flooring plane), top plane (e.g., the ceiling plane) and so forth. The user may further select or add points that automatically connect to previous points, thus providing lines of edges of a place. As we already know the ceiling height, the other three edges of a plane are automatically formed. The lines thus formed may help the user define the planes of the 2D environment more precisely. Precise and accurate defining of the 3D environment that matches the 2D environment, is useful for the user to position and move 3D objects in the 2D environment or to import additional 3D objects into the 2D environment.

Further, the user may save the resulting image of the 3D object or 3D objects in the 2D environment to a personal computer (PC) or network database for future use or reference, or post the resulting image on a social network, and perform other operations on the image. Further, the user may have some previously saved images which the user may use to compare with the newly obtained images in order to select preferable combinations of a 3D object in a 2D background.

Additionally, the user may be connected to various social networking services and/or microblogs, such as Facebook™, Twitter™, and other such networking services. Connection to social networking services and/or microblogs may allow a user to interact with his contacts to share and obtain opinion and feedback on an image obtained after placing 3D objects in 2D environment. Further, the user may also request help from designing services to arrange 3D objects within a given 2D environment.

Visualization and addition of 3D objects to any 2D environment provides ample opportunities in various spheres of human life. Spatial representation of 3D objects may help in comprehending and learning, designing and drafting, efficient space management, and accelerated decision making and planning. The ability to represent virtual 3D objects in a real environment can provide further applications, such as selecting furniture for a house, designing kitchen cabinets, selecting display and presentation equipment for conference rooms, presentation layouts for tradeshow booths, industrial planning and industrial equipment placement, medical equipment placement, and other space and design applications.

Figure 2:
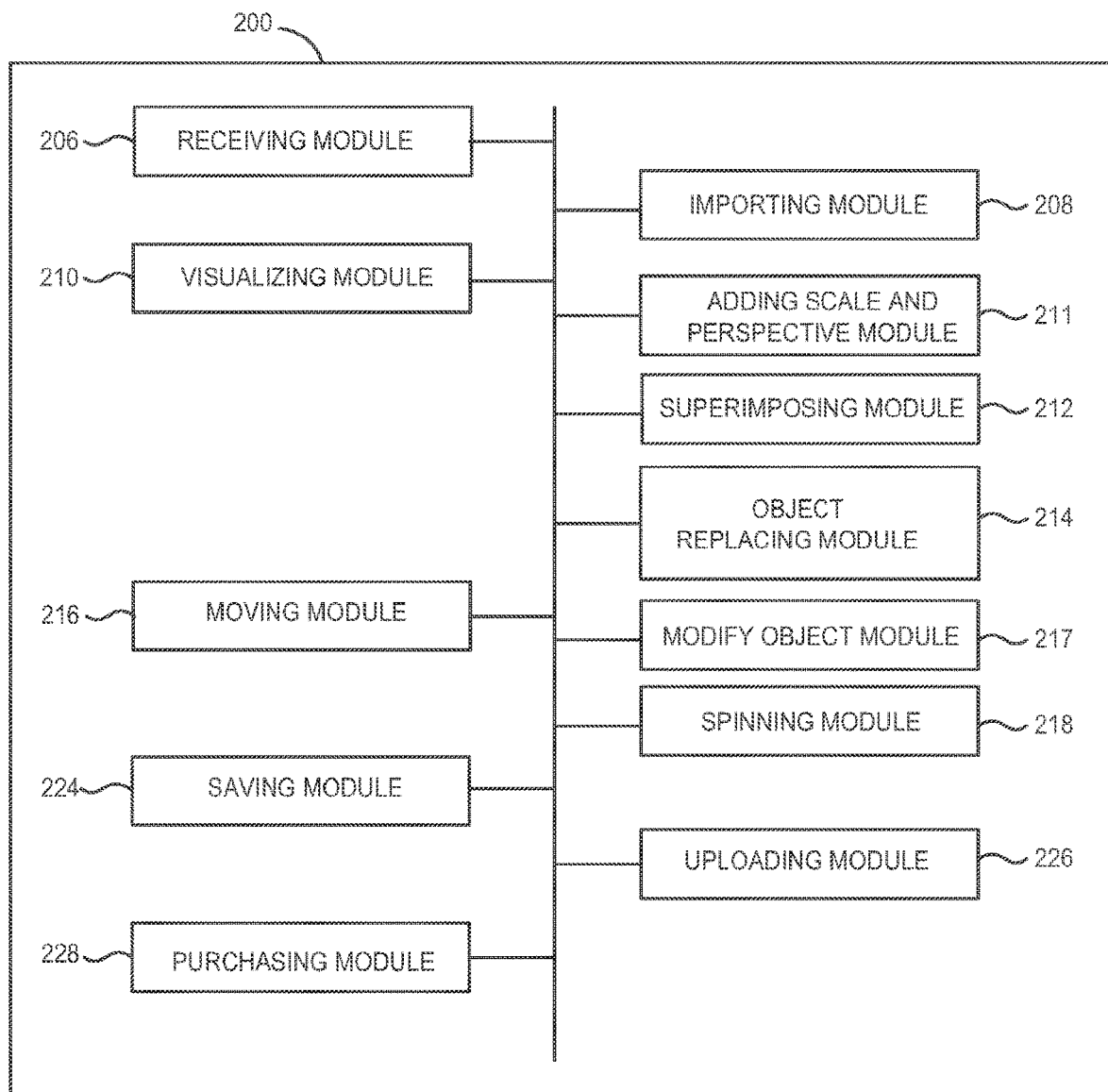
FIG. 2 is a block diagram showing various modules of an engine for visualization of 3D models of objects in a 2D environment, in accordance with various embodiments.
Figure 3A:
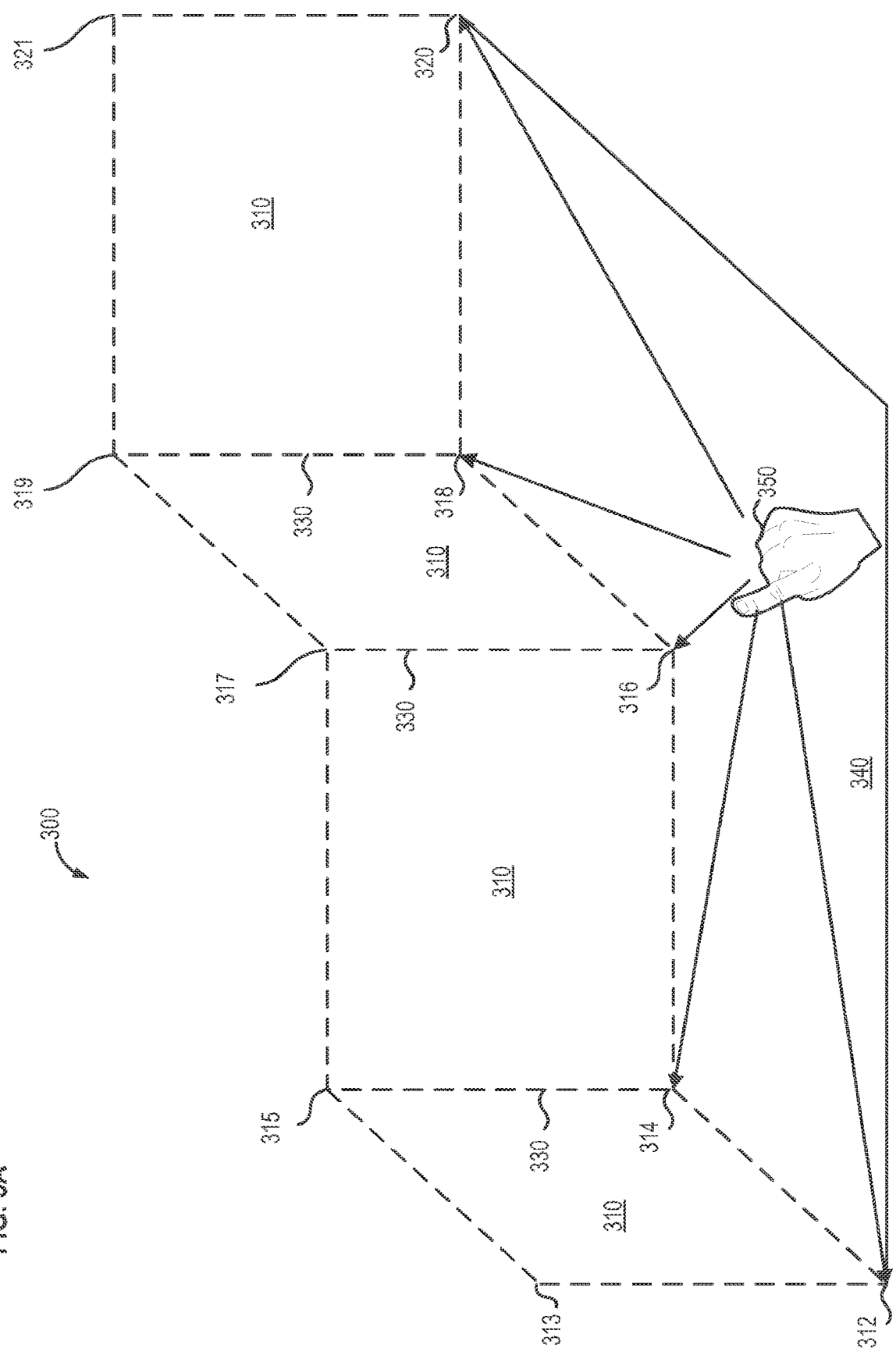
FIGS. 3A, 3B and 3C are example representations of the 2D environment 300 with a user providing wall location on the 2D environment to form a 3D model of the 2D environment.
Figure 3B:
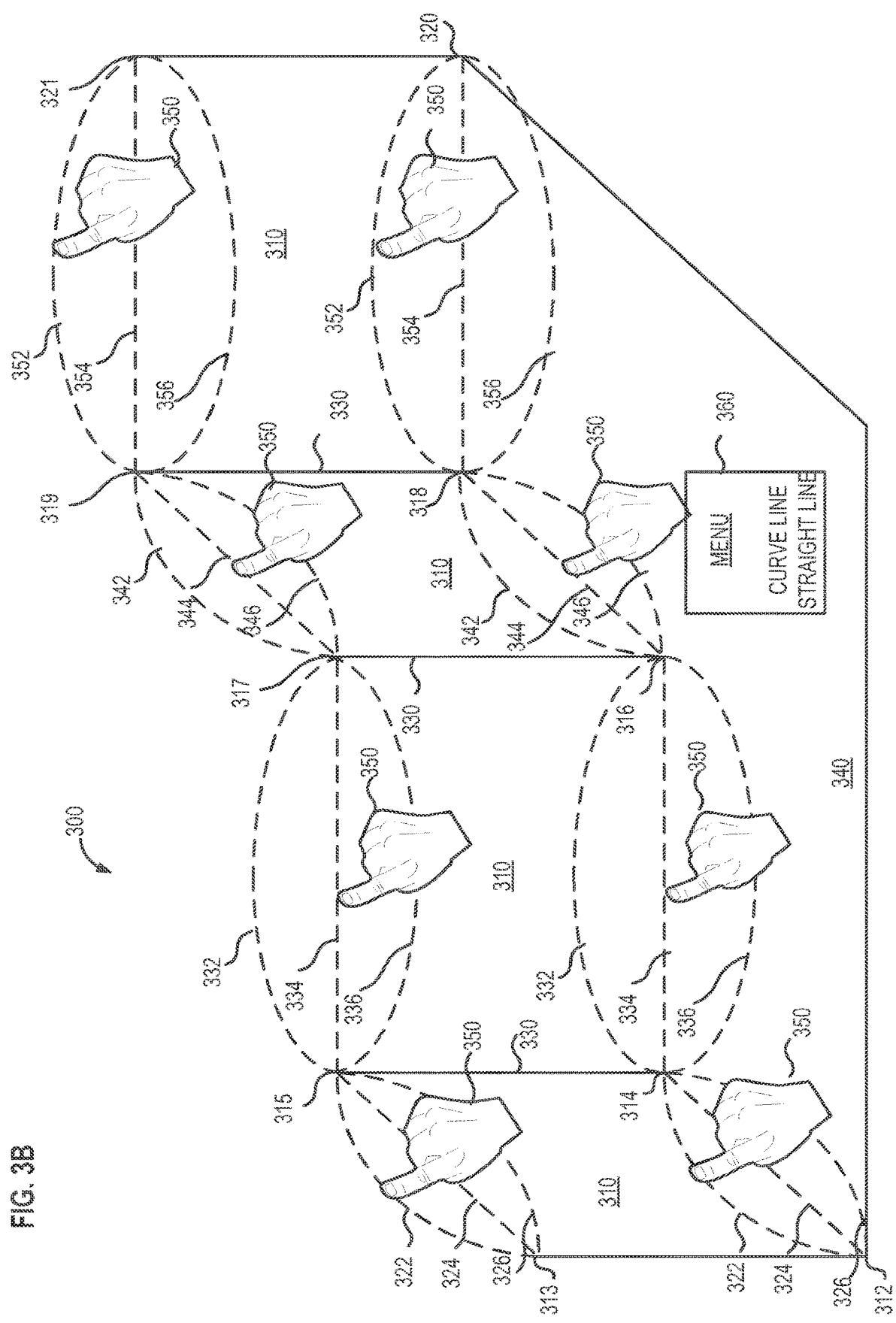
Figure 3C:
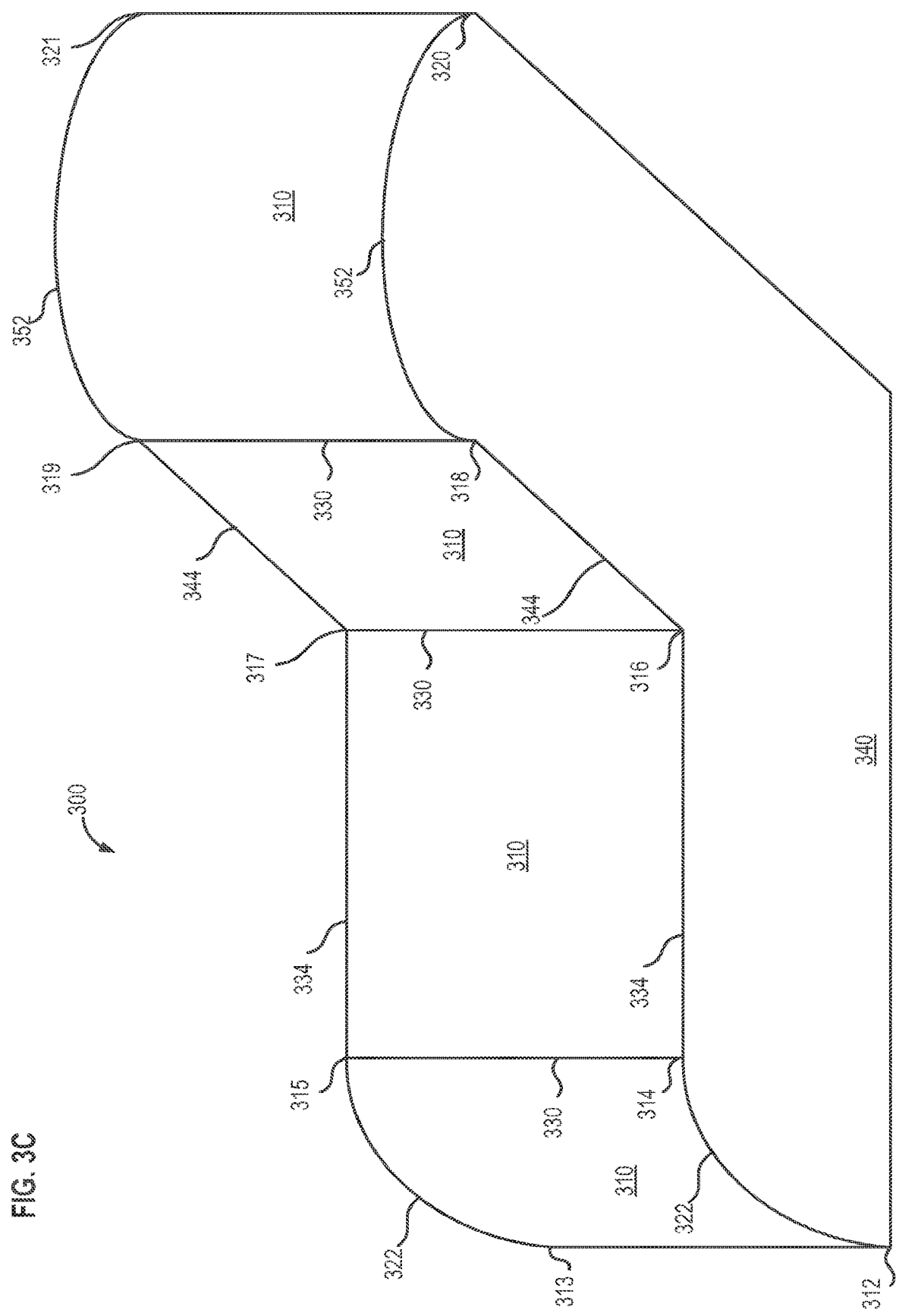
Figure 3D:
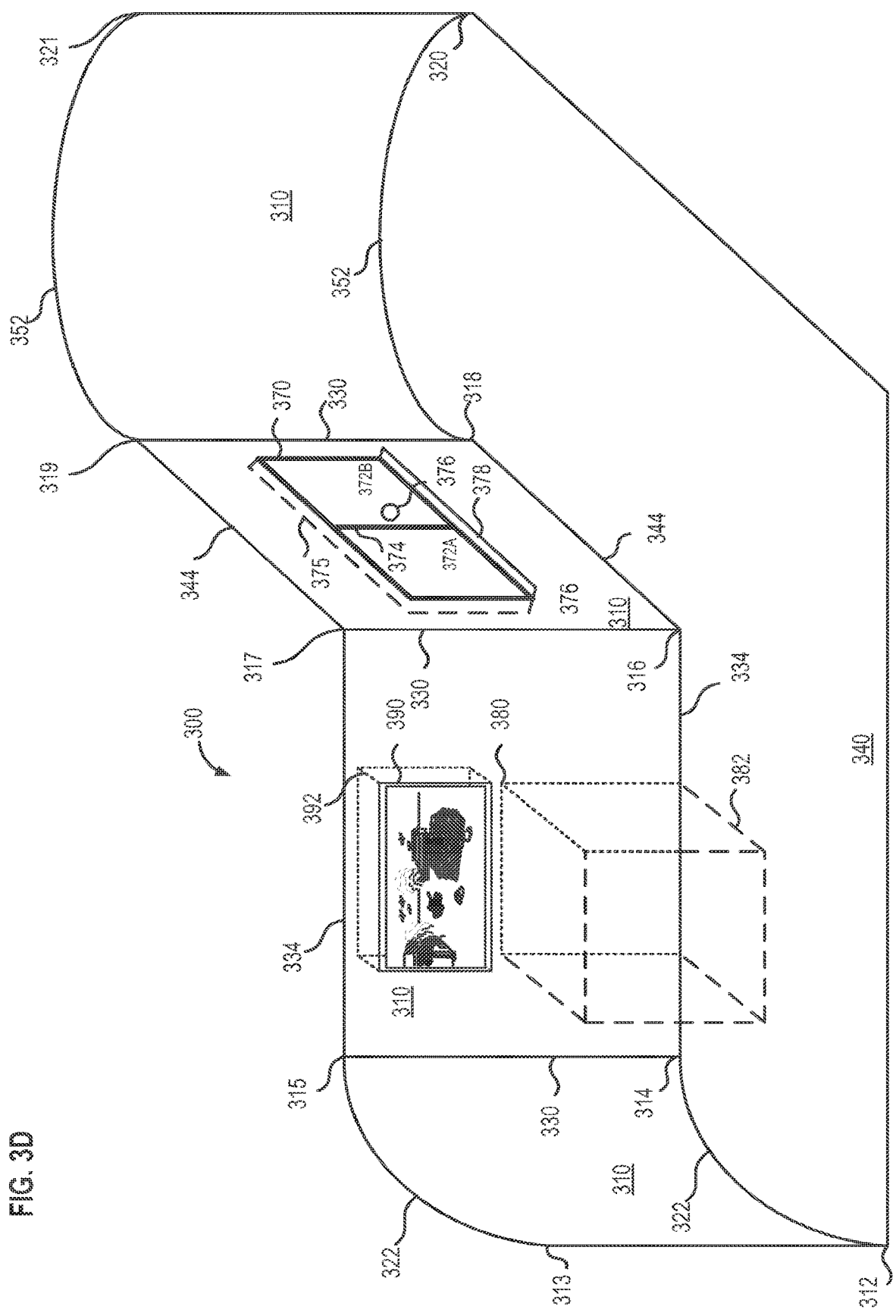
FIG. 3D is a further example of the 2D environment 300 along with a wall object.

FIG. 1A is a block diagram illustrating the overall system for visualization of 3D models of objects in a 2D environment, in accordance with various embodiments of the present application. FIG. 2 is a block diagram showing various modules of an engine for visualization of 3D models of objects in the 2D environment. FIGS. 3A, 3B and 3C are example representations of the 2D environment 300 with a user providing wall location on the 2D environment to form a 3D model of the 2D environment. FIG. 3D is an example of the 2D environment 300 along with a wall object. FIG. 4 is an example flowchart for a method of placing an object in the 2D environment with additional scale and perspective. FIGS. 5A and 5B are examples of enhanced wall tagging. FIGS. 6A, 6B, 6C and 6D are further example representations forming a 3D model of a space corresponding to the 2D environment. FIG. 7 illustrates an example of a computer network system, in which various embodiments may be implemented.

FIG. 1A illustrates a block diagram of an overall system 100 for visualization of 3D objects in a 2D environment, in accordance with various embodiments of the present disclosure. Overall system 100 may include a user 120, user devices 130, a user interface 140, an engine 200 for virtual visualization of 3D models of objects in 2D environment, a network 202, and various web applications 204. The user devices 130 may include a mobile phone 132, a personal computer (PC) 134, a personal digital assistant (PDA) 136, a tablet PC 137, a wearable computer device 138 such as Google Glass™ and Recon Jet™, a 3D scanner 139 and the like. The user 120 via user devices 130 interacts with the user interface 140. The user may also directly interact with the user interface via touchscreen, keyboard, mouse key, touch pad and the like. The engine 200 for visualization of 3D objects in 2D environment may comprise of local device-based, network-based, or web-based service available on any of the user devices 130. The user may further interact with the web applications 204. The web applications may include social networking services.

The user 120 may interact with the user interface 140 via the user devices 130. The system for virtual visualization of 3D models of objects in 2D environment 300 may be implemented on a local device or via a network-based or web-based service accessible via user devices 130. The user 120 may periodically interact with the system for virtual visualization of 3D models of objects in 2D environment 300 via the user interface 140 displayed using one of the user devices 130. Additionally, the user 120 may periodically interact with the web application 204 such as a social networking service (including social networks, microblogs, web blogs, and other web resources) via the system for virtual visualization of 3D models of objects in 2D environment 300 and the network 110 to upload graphics obtained using the system for virtual visualization of 3D models of objects in 2D environment 300, communicate with members of the social networking service, or request help from design services, or purchase a 3D object through web applications 204.

The user devices 130, in some example embodiments, may include a Graphical User Interface (GUI) for displaying the user interface 140. In a typical GUI, instead of offering only text menus or requiring typed commands, the engine 200 may present graphical icons, visual indicators, or graphical elements called widgets that may be utilized to allow the user 120 to interact with the user interface 140. The user devices 130 may be configured to utilize icons in conjunction with text, labels, or text navigation to fully represent the information and actions available to users.

The network 202 may include the Internet or any other network capable of communicating data between devices. Suitable networks may include or interface with one or more of, for instance, a local intranet, a Personal Area Network (PAN), a Local Area Network (LAN), a Wide Area Network (WAN), a Metropolitan Area Network (MAN), a virtual private network (VPN), a storage area network (SAN), an Advanced Intelligent Network (AIN) connection, a synchronous optical network (SONET) connection, Digital Subscriber Line (DSL) connection, an Ethernet connection, an Integrated Services Digital Network (ISDN) line, a cable modem, an Asynchronous Transfer Mode (ATM) connection, or an Fiber Distributed Data Interface (FDDI) or Copper Distributed Data Interface (CDDI) connection. Furthermore, communications may also include links to any of a variety of wireless networks, including Wireless Application Protocol (WAP), General Packet Radio Service (GPRS), Global System for Mobile Communication (GSM), Code Division Multiple Access (CDMA) or Time Division Multiple Access (TDMA), cellular phone networks, Global Positioning System (GPS), Cellular Digital Packet Data (CDPD), Research in Motion (RIM), limited duplex paging network, Bluetooth radio, or an IEEE 802.11-based radio frequency network. The network 202 may further include or interface with any one or more of an RS-232 serial connection, an IEEE-1394 (Firewire) connection, a Fiber Channel connection, an IrDA (infrared) port, a Small Computer Systems Interface (SCSI) connection, a Universal Serial Bus (USB) connection or other wired or wireless, digital or analog interface or connection, mesh. The network 202 may be a network of data processing nodes that are interconnected for the purpose of data communication.

Figure 1B:
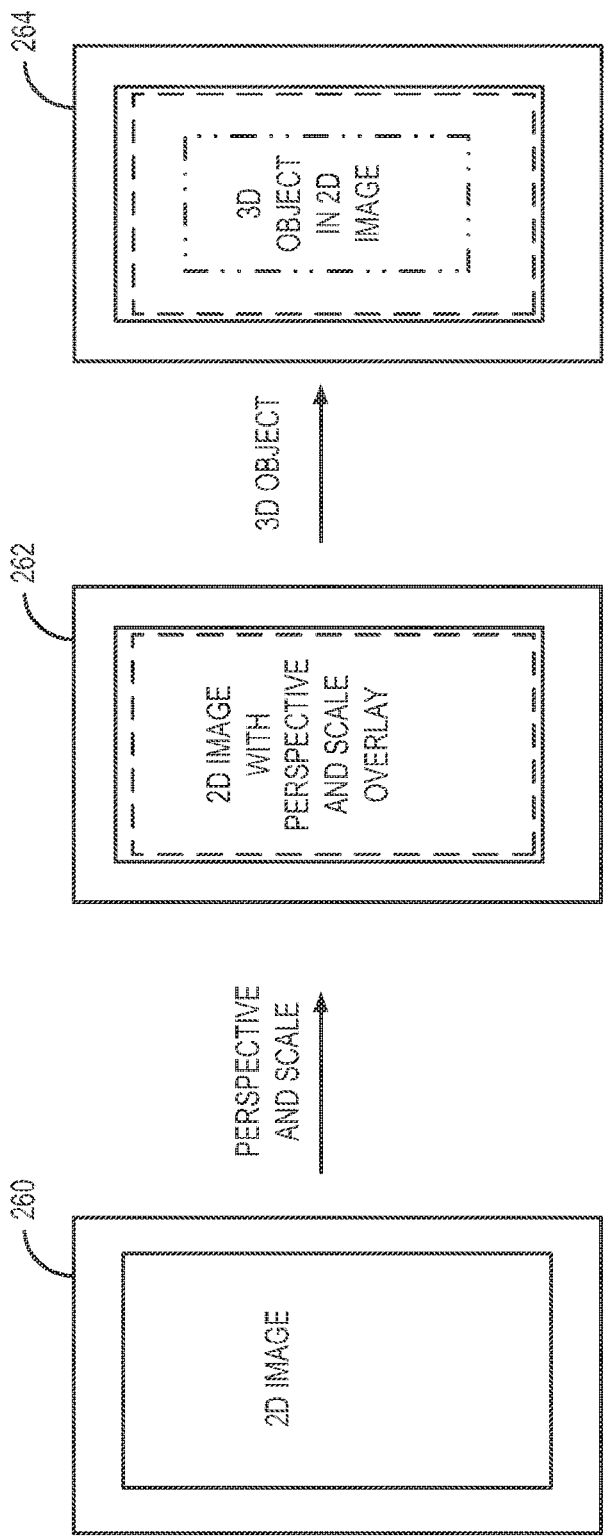
FIG. 1B is a schematic illustration of a system for visualization of 3D model of objects in a 2D environment.

FIG. 1B is a schematic illustration of a system for visualization of 3D models of objects in a 2D environment. Specifically, as shown and described in more detail herein, a 2D environment may be provided including a 2D image 260. The 2D image 260 may be a photograph, line drawing or video. For example, the 2D image may be a picture of a room or part of a room. The 2D image 260 may be a personalized image captured by a user's hand-held device or other computing device. In other examples, the 2D image 260 may be saved or imported from a storage device on a remote server or other device.

Perspective and scale may be added to the 2D image 260. The perspective and scale may be saved as part of the image such that the 2D image is now a combined image 262 having both the 2D information and perspective and scale information associated with the 2D image.

In some examples and as described in more detail herein, walls may be selectively positioned within the image. Further, in some examples, a 3D object may then be positioned within the 2D image with perspective and scale overlay, combined image 262. The 3D object may be realistically positioned within the resulting image 264 based on the perspective and scale overlay information. Further, the 3D object may be positioned within resulting image 264 such that the 3D object may be perceived in three dimensions within the 2D environment.

FIG. 2 illustrates a block diagram for the engine for virtual visualization of 3D models of objects in 2D environment 300. The engine for virtual visualization of 3D models of objects in 2D environment 300 may include a receiving module 206, an importing module 208, a visualizing module 210, an adding scale and perspective module 211, a superimposing module 212, an object replacing module 214, a moving module 216, a modify object module 217, a spinning module 218, a saving module 224, an uploading module 226 and a purchasing module 228.

Although various modules of the engine for visualization of 3D models of objects in 2D environment 300 are shown together, the engine for visualization of 3D models of objects in 2D environment 300 may be implemented as a web service, via a distributed architecture, or within a cloud computing environment. The files created with this application may contain perspective, scale and 3D model information in addition to the 2D graphic background information. The files may be shared, or sent to, or opened on any user devices which may be configured to display these files.

The receiving module 206 may be configured to receive inputs from the user 120 regarding an import request. The import requests may include user-specified data regarding a 2D environment, such that the 2D environment may be used as a background environment for displaying one or more 3D models of objects. The importing module 208 may be configured to import the 2D environment. The 2D environment may be a 2D photograph of an interior space such as a living room, or a bedroom, or a kitchen space, or a bathroom, or a garage, or an office space, and so forth.

The visualizing module 210 may help the user 120 to visualize the imported 2D environment. The visualizing module 210 may be configured to receive a superimposing request from the user 120. The superimposing request may receive object information data related to a 3D object. The 3D object is associated with object information data which may include metadata encoding one or more of a set of parameters relevant to the 3D object, manufacturer's guidelines, regulations and guidelines governing the 3D object, safety guidelines for the 3D object, and any other relevant information specific to the 3D object.

The object information data may include metadata defining the behavior of the 3D object within the 2D environment. For example, a 3D object may include metadata defining an object as one of a wall object, ceiling object, floor object, or combination thereof. The metadata may further define the placement and movement of the object within the environment.

The object information data may also include metadata encoding an information tag. The information tag may include a description of the 3D object including dimensions, materials, cost, manufacturer, and other information specific to the 3D object discussed below.

The object information data may also include metadata encoding graphical data, spatial data, and other rendering data for superimposing the 3D object within the 2D environment. Graphical, spatial, and rendering data may be processed by a computing device to generate and display the 3D object to the user.

The parameters may include attributes, instructions, behavior characteristics, visualizations to be displayed by the 3D object, and other such scripts associated and essential for graphical use of the 3D object. For example, the parameters may include, but are not limited to, geometric attributes, depth value, color value, the physical dimensions of the 3D object, mounting requirements for the 3D object, metadata identifying the 3D object as a floor object, wall object, ceiling object, or combination thereof, power requirements, length of a power cord, and any other relevant information describing the 3D object.

Additionally, the object information data may include additional parameters such as manufacturer's guidelines and/or safety guidelines for safe and proper installation and operation of the 3D object. For example, the object information data may include metadata encoding a minimum clearance or spatial requirement surrounding the 3D object. The minimum clearance/spatial requirement may be required for adequate ventilation of the 3D object, prevention of fire hazards, noise control, clearance of moving parts of the 3D object, or to satisfy any other personal safety, medical safety, or industrial safety standard. As an example, a display may require 6 inches clear from the cooling fan gratings to allow for proper airflow to cool the electric internals within the display. As another example, in a medical application, a magnetic resonance imager may generate an electro-magnetic field in an area surrounding the magnetic resonance imager that may interfere with other electrically powered or magnetically sensitive medical equipment, personal medical equipment such as a pacemaker, and any magnetic material that may be drawn to the magnetic resonance imager by magnetic attraction. In an industrial application, some industrial equipment have moving or rotating parts that may extend past the main body of the piece of industrial equipment. Therefore, to allow for proper operation of the industrial equipment, other equipment or objects may be located outside a minimum clearance or spatial requirement surrounding the piece of industrial equipment.

In another example, in a restaurant environment, the tables, chairs, and other objects within the restaurant space may be required to be arranged such that a minimum clearance surrounding each object is maintained and that pathways for traversal are maintained clear and of sufficient dimensions to meet federal and local accommodation codes. Therefore, each chair and each table may include a minimum clearance or spatial requirement surrounding the table or chair to meet the governing guidelines.

In another example, in a retail environment, retail display fixtures may be arranged within the retail space such that a minimum clearance surrounding each fixture may be maintained to allow shoppers to easily move within the retail space and to meet federal and local accommodation codes. In addition to satisfaction of the governing access codes, the 3D models of the display fixtures and accompanying merchandise may be arranged within the 2D image of the retail space allowing retail planners to efficiently design retail merchandising plans, design retail exhibit plans, and then electronically distribute the design plans to the stores. Further, the retail merchandising teams at the stores may propose amendments to the design plans that are specific to the available retail space within the store accounting for differences due to the specific architectural design of the store space. These amendments may then be reviewed and approved by the retail planners, thereby providing an advantage of an efficient and electronic means of distributing, amending, and approving retail merchandising plans.

The object information data may be provided by multiple sources, including but not limited to, one or more of the manufacturer of the 3D object, government safety regulations such as provided by the Occupational Safety and Health Administration or other Federal or local governing body, federal and local accommodation codes such as the Americans with Disabilities Act and federal, state, and local fire codes, the user may provide the object information data, object information data may be downloaded from a remote database, encoded by an asset manager or managing service providing the 3D objects, or any other suitable means. It will be appreciated that the listed sources of object information data are not intended to be limiting.

In some embodiments, the object information data may include one or more spatial requirements. The spatial requirements may exceed the geometric dimensions of the 3D object and govern interactions between the 3D object and other object entities. The spatial requirements of a 3D object may be specific to the object based upon one or more of a manufacturer's recommendation, imported from a remote database, government regulation, configured by the user, or any other suitable source.

In some embodiments, the two-dimensional environment may also include environmental information data. The environmental information data may include metadata which may encode one or more of a set of properties relevant to the 2D environment, regulations and guidelines governing the 2D environment such as governing access regulations, industrial safety standards, and governing fire codes, safety guidelines for the 2D environment, and any other relevant information specific to the 2D environment. The properties encoded by environmental information data may include one or more of the dimensions of the 2D environment, characteristics of the 2D environment governing the behavior and movement of 3D objects within the 2D environment, locations of power supplies and the voltage and frequency supplied, construction information such as location of load bearing members, allowable load information, construction materials, available ventilation, acoustic information, fixed lighting sources, and any other information relevant to the two-dimensional environment.

As discussed above, the environmental information data may be provided by multiple sources such as one or more of government safety regulations such as provided by the Occupational Safety and Health Administration or other Federal or local governing body, federal and local accommodation codes such as the Americans with Disabilities Act and federal, state, and local fire codes, the user may provide the object information data using the modify object module, object information data may be downloaded from a remote database, encoded by an asset manager or managing service providing the 3D objects, or any other suitable means.

In these embodiments properties of the 2D environment may be retrieved from the environmental information data and analyzed to determine interaction with 3D objects within the 2D environment. As a non-limiting example, one or more threshold barriers between two planes of the 2D environment may be adjusted to satisfy one or more conditions encoded in the metadata of both the environmental information data and the object information data.

The user 120 may select the 3D object from a library of 3D objects or from 3D objects imported or saved by the user, which the user may have customized or made changes to. The received superimposing request is passed to the superimposing module 212, which superimposes the selected 3D object, based on the superimposing request onto the 2D environment.

A non-limiting example of a 3D object may be a display. The display may be any of a television, monitor, computer monitor, or visual array including, but not limited to, a liquid crystal display (LCD), light emitting diode (LED) display, organic light emitting diode (OLED) display, cathode based display, or any other display device capable of providing a visual image to a viewer. The display may comprise any of a plurality of shapes, such as square, rectangular, curved, round, or any suitable geometric shape. Further, the display may include a support frame, may be frameless, or any other structural form factor known in the art. The display may be a stand-alone display or one of a plurality of display units comprising a composite display including multiple display units.

In addition, the visualizing module 210 may be further configured to receive a request for object replacement from the user. The object replacement request may include object information data or metadata encoding object information data including dimensions, or color, or material type of the 3D object selected from the library of 3D objects. The received object replacement request is passed to the object replacing module 214, which changes the object, based on the request. Additionally, the selected 3D object may be replaced by the user 120 with another 3D object. For example, the user may replace a large chair with a small chair in a 2D environment after visualizing both the large chair and the small chair in the 2D environment.

In some embodiments, the physical properties of the 3D object, interaction between object entities and between object entities and the environment may be analyzed by the visualizing module 210 using the object information data and environmental information data.

The visualizing module 210 may further help the user 120 to alter view settings such as brightness or contrast of the imported 2D environment. Altering the brightness or contrast of the 2D environment may allow the user to visualize the positioning of the 3D object in the 2D environment under more light or less light situations. For example, the user may be able to visualize and appreciate how the 3D object superimposed on the 2D environment may look during day time versus night time conditions, or conditions of bright lighting or dim lighting where a lamp or light fixture is being used. Additionally, the visualizing module 210 may also help the user with directional options, such as a compass or a north facing arrow to identify the orientation of the 2D environment. The user may prefer to have directional options for personal reasons, or aesthetic preference, or for daylight requirement needs.

The visualizing module 210 may be further configured to receive scale data (defining the scale of the 2D environment) and the perspective data (defining the perspective of the 2D environment) request from the user. The scale data and perspective data request is passed on to the adding scale and perspective module 211, which allows the user to adjust the scale and perspective of the 2D environment.

The method then moves on to the moving module 216. The moving module 216 may be configured to receive an object spinning request for rotational movement of the 3D object imported on to the 2D environment. The spinning request thus received is passed on to the spinning module 218, which allows spinning or any such rotational movement of the 3D object in the 2D environment. For example, the 3D object inserted onto the 2D environment might be a chair or triangular table, and the user may prefer to precisely orient the chair seat in a particular direction or in case of the triangular table, the user may prefer to have the three corners of the table orient in a certain preferred directions.

The user may also modify one or more properties of the 3D object by changing the color, material, and/or dimensions of the 3D object. The modify object module 217 may be configured to receive a request to change one or more properties of the 3D object. For example, a user may have a recessed space within a wall plane 310 as illustrated in FIG. 3D. The user may choose a display 390 to place in the recessed space. The user may change the color of the framing of display 390 to match the color of wall plane 310. Returning to FIG. 2, the modify object module 217 may receive the request to change the color of the framing of display 390 and change the color of the display framing.

As the user finalizes the appropriate color, material, positioning and spinning of the selected 3D object within the 2D environment, the resulting image may be uploaded to a social network website, microblogging service, blog or any other website resources by the uploading module 226. Thereby, the user 120 may receive inputs from contacts such as family members or friends regarding the resulting image formed by the 3D object placement in the 2D environment. With appropriate inputs, the user 120 may choose to alter the resulting image of the 3D object in the 2D environment. In addition, based on user request, the saving module 224 may save the resulting image for future use or reference. Alternatively, the user 120 may be highly satisfied with the overall look of the 3D object in the 2D environment and decide to purchase the 3D object. In such a situation the purchasing request is passed to the purchasing module, 228. In some embodiments, a contact of the user 120 via social networking web sites in the web application 204, may request the user to purchase the 3D object in consideration.

FIG. 3A illustrates an example 2D environment 300. The example 2D environment 300 may include an interior space bound by a ground plane (e.g., a flooring surface) 340, and four wall planes, 310 separated by intersection lines 330 between adjacent wall planes. In the example shown here, the finger icon 350 or other suitable indicator may select a set of intersection points 312, 314, 316, 318, 320 on the ground. The intersection points 312, 314, 316, 318, 320 may define points between wall planes 310 and ground plane 340. As the ground plane points are defined, the intersection points 313, 315, 317, 319 and 321 formed between the wall planes 310 and the top plane and intersection lines 330 between the ground plane points and corresponding intersection points are automatically generated.

It should be appreciated that as described herein, a user may indicate two or more intersection points along the ground and wall plan and such intersection point may be sufficient to tag and generate a wall placement. The scale and perspective within the drawing enables the user to indicate a wall intersection and then the system may infer the wall position creating a wall normal to the ground plane. Further, gyroscope information from the electronic device provide information describing the orientation of the electronic device acquiring the 2D image. The gyroscope data may be employed with at least two wall-floor intersection points on a same wall to automatically generate a wall plane.

Turning to FIG. 3B, the finger icon 350 or other suitable indicator may connect the intersection points discussed above by intersecting lines. For example, the user may use the finger icon 350 or other suitable indicator to select a straight line 344 that connects points. In some embodiments, the lines are automatically formed as the intersecting points are defined. The user may further select a wall and adjust the curvature of the wall.

In further embodiments, a menu bar 360 may be displayed to the user wherein the user may have the option of selecting a concave line 342 to connect intersection points 316 and 318, instead of the straight line 344 to connect intersection points 316 and 318, or a convex line 346 to connect intersection points 316 and 318. In the example shown in FIG. 3B, the user selects the straight line 344 to connect the intersection points 316 and 318 on the ground plane. Correspondingly, the top straight line 344 may change to match the concave line 342 or the convex line 346.

Similarly, the user may have the option to select a concave line 322, or a straight line 324, or a convex line 326, between pair of intersection points 312 and 314. For the intersection points 312 and 314 on the ground plane, the user may select the concave line 322. Consistently, the intersection points 313 and 315 on the top plane may be connected by the concave line 322.

The user may prefer to select the straight line 334 to connect neighboring intersection points 314 and 316 on the ground plane. Similarly, the user may select the straight line 334 between the intersection points 315 and 317 on the top plane. The user may also select concave line 332 or convex line 336.

Further still, the user may select the concave line 352, to connect the intersection points 318 and 320 on the ground plane. Consistently, the user may select the concave line 352 to connect the intersection points 319 and 321 on the top plane. As discussed above the user may alternatively select straight line 354 or convex line 356.

FIG. 3C illustrates the final image after the user selects the intersection points and the intersecting lines between the different planes in the 2D environment. The 2D environment 300 may be defined by the user to include wall planes of different shape and intersecting lines of different shapes between wall planes and ground plane and between wall planes and top planes.

FIG. 3D illustrates an example of the 2D environment 300 with a window 370, inserted and flush with the wall plane 310. The window 370 may further include a first window pane 372A and a second window pane 372B, separated by a window grid 374. The first window pane 372A, the second window pane 372B, along with the window grid 374 may also be configured to remain flush with the wall plane 310 when viewed in perspective. Similarly, in some embodiments, other parts of the window 370, such as a window rim or a window hinge may be inserted in the wall plane 310, such that the window rim and the window hinge may not be extending out of the wall plane 310. It should be appreciated that a user may select wall objects and position them on a new wall. The wall objects may adjust to the wall position, with the object appropriately positioned such that features which extend from the wall plane (either in front of the wall plane or behind the wall plane) are properly visualized such that the wall object features which are flush with the wall plane are shown as flush or level with the wall plane.

Additionally, the window 370 may include a window knob 376 and a window sill 378. The window knob 376 and the window sill 378 may protrude inside the room environment of the 2D environment 300. In contrast, the window may further include a window ledge, or a window header behind the wall plane 310 (not shown), which may be configured to extend out from the wall plane 310, instead of extending inwards. As indicated at 375, a portion of the object may be positioned behind the plane of the wall. In some examples, a user may select to keep such portions of objects extending behind the wall invisible, while in other examples, a user may select to view portions of objects which extend beyond the plane of the wall.

As another example, the wall plane 310 may include a display 390. Display 390 may be mounted such that the display is flush with the wall plane 310, where a portion of the display 390 extends behind wall plane 310 into a recessed space. The recessed space may be visualized by one or more wall-hidden surface intersection lines 392 connecting wall plane 310 to a second plane located behind wall plane 310. In some embodiments, the user may select to view the recessed space and wall-hidden surface intersection lines 392 behind the wall plane 310 as shown. Further, the dimensions of display 390 may be matched to the dimensions, length, width, and depth, of the recessed space. It will be appreciated that although a display 390 is illustrated, 3D objects such as decorative objects, audio-visual equipment, wall art, or any 3D object selected by the user and fitting the dimensions of the recessed space may be superimposed onto the 2D environment in the recessed space.

As another example, the wall plane 310 may extend into the space of the 2D environment to a second plane in front of the wall plane 310 forming an additional surface within the 2D environment. The additional surface may be a horizontal planar surface, a concave surface, a convex surface, an inclined planar surface, or the like. In this example, the wall plane 310 may extend outward forming a mantle, wall shelf, or other suitable architectural structure. Wall-hidden surface intersection lines may extend from the second plane in front of the wall plane 310 to the wall plane 310 visualizing the geometry of the additional surface. The user may select to view the wall-hidden surface intersections lines as described above. Further, the user may position any suitable 3D object upon the additional surface.

Alternatively, the wall plane 310 may include a door. The door may be inserted such that the door is flush with the wall plane 310. Parts of the door, such as a door frame, a door panel, a door hinge, a door threshold may be configured to remain flush with the wall plane 310. Further embodiments may further include parts of the door, such as a door bolt, a door knob, a door header, which may extend out from the wall plane 310.

As another example, a room or part of a room may be positioned behind a wall, such as the room indicated at 380. Invisible planes 382 may define the room which extends behind the visible wall plane. In some examples, a user may select to view a "hidden" room or one or more of the invisible wall planes.

FIG. 4 illustrates an example flow chart of a method 400 for positioning and aligning 3D objects in 2D environment. The method 400 may be performed by processing logic that may comprise hardware (e.g., programmable logic, microcode, and so forth), software (such as computer code executable on a general-purpose computer system or a specifically configured computer system), or a combination of both. The processing logic resides at the engine 200 for virtual visualization of 3D models of objects in 2D environment, as illustrated in FIG. 2. The method 400 may be performed by the various modules discussed above with reference to FIG. 2. Each of these modules may comprise processing logic.

Method 400 begins at operation 404 where the user 120 may obtain a 2D environment according to an import request. Then the receiving module 206 may receive, from the user, scale and perspective data on ground plane at operation 406. Similarly, the receiving module 206 may receive, from the user, scale and perspective data on ceiling height at operation 408. The user may define the ceiling and ground plane by selecting points on the 2D environment.

Method 400 continues at operation 420, for positioning 3D models of objects. At operation 422, the receiving module 206 may receive a request to superimpose 3D models of objects onto the 2D environment. A superimposing request may include a user selecting a 3D object from a library of 3D models of objects (in the engine for virtual visualization of 3D models of objects in 2D environment 300), from 3D models of objects saved or imported by the user, or 3D models of objects obtained from online resources.

Method 400 may include locate walls 410 including operations 412, 414, 415, and 416. At operation 412, the user may select intersection points between different planes, where the plane may be a wall plane, a ground plane, a top plane, and so forth. At operation 414, the user may generate wall plane based on selection of intersection points and intersecting lines between different planes. At operation 415, the user may modify the wall plane. The user may change any of a shape, depth, and/or contour of the generated wall plane. At operation 416, if the user decides to include additional wall-floor intersection points, then the method returns to operation 412. If the user decides not to include additional wall-floor intersection points, then the method moves to operation 422 to obtain 3D objects to be placed within the 2D environment.

At operation 424, the selected 3D model of the object may be superimposed on the 2D environment relative to the scale and perspective of the 2D environment. As discussed above in reference to FIG. 2, the moving module 216 may receive a request to move the 3D objects in the 2D environment. The request to move or reposition the 3D objects may include data on the selection of a direction by the user. As examples, the 3D objects may be moved in a vertical and/or horizontal direction. As another example, the 3D object may be rotated about a vertical, horizontal, and/or other rotational axis. The 3D objects may be wall objects, such as windows, posters, lighting fixtures, doors, etc. Further, in some examples, vents, outlets, speaker systems, television displays, may be identified as the 3D object for positioning in the space geometry.

At operation 428, the user may decide to superimpose additional 3D objects in the 2D environment. If the user prefers not to add any more 3D objects then the method comes to an end. If the user decides to add more 3D objects to the 2D environment, then the method returns to operation 422.

FIGS. 5A and 5B illustrate a method for enhanced wall tagging. Shown in FIG. 5A, is a 2D environment 500 with a ground plane 502 and a top plane 503. The user may select a point 504, a point 506 and a point 508, on the ground plane 502, which may be joined by intersecting lines. Once the ground plane points 504, 506 and 508 are selected, a point 516, a point 518 and a point 520 may be configured to appear concurrently on the top plane 503. The user may tap on the region between the point 504 and the point 516 to form an intersecting line 510. Similarly, the user may tap on the area between the point 506 and the point 518 to form an intersecting line 512, and further on the area between the point 508 and the point 520 to form an intersecting line 514. Thereby, a wall 522 may be formed by the points 504, 506, 518 and 516. Similarly, a wall 524 may be formed by the points 506, 508, 518 and 520.

In addition to the wall formation, the method herein, may allow the user to extend the walls. As depicted in FIG. 5B, the ground plane points 504 and 508 when not connected to the corresponding top plane points, may indicate extended walls. For example, the wall 522 or the wall 524 may not be required to stop within the 2D environment 500. In this case, the user may not be able to see the entire wall but may be able to visualize a larger area. The points 504, 516, 508 and 520, are no longer corner points for the wall 522 and the 524. As shown in FIG. 5B, the wall 522 and the wall 524 do not have a definite ending. Therefore, the user may be able to visualize spaces that extend beyond the field of view of the 2D environment.

In some embodiments, the walls 522 and 524 may include a passageway such as a corridor or a hallway. In further embodiments, the extension of the wall 522 and the wall 524 may allow the user in placing 3D models of objects in the 2D environment 500. For example, if the user prefers to place a couch in the 2D environment 500, the user may position the couch to extend beyond the intersecting lines 510 and 514. As illustrated in FIG. 5B, the points 504 and 516, do not define corners, these are points within the wall 522. Similarly, the points 508 and 520, are not corner points, instead, these are points within the wall 524. The wall extension enables the user to visualize larger environments and thereby position 3D models of objects which otherwise the user may not have included in the environment.

In some examples, a phantom edge 530 may be displayed. Alternatively, a phantom edge may be hidden. The phantom edge may be used as a reference or guide. In some embodiments, a user may adjust or select the phantom edge when positioning 3D objects within the room, such as, for example, using the phantom edge for a guide for placement but not as a limit or cap for placement.

FIGS. 6A-6D illustrate example representation of 2D environment 600 wherein the user may be able to select intersecting points and intersecting lines between different planes (a wall plane, or a ground plane, or a top plane) of the 2D environment and form walls by selecting the intersecting points and lines, thereby forming the 3D model space matching the 2D environment.

Turning now to FIGS. 6A, 6B, 6C and 6D. FIGS. 6A-6D may illustrate another example 2D environment 600. The example 2D environment 600 may include an interior space bounded by a ground plane 602 (e.g. a flooring surface), a wall plane 604 and a wall plane 606.

Figure 6A:
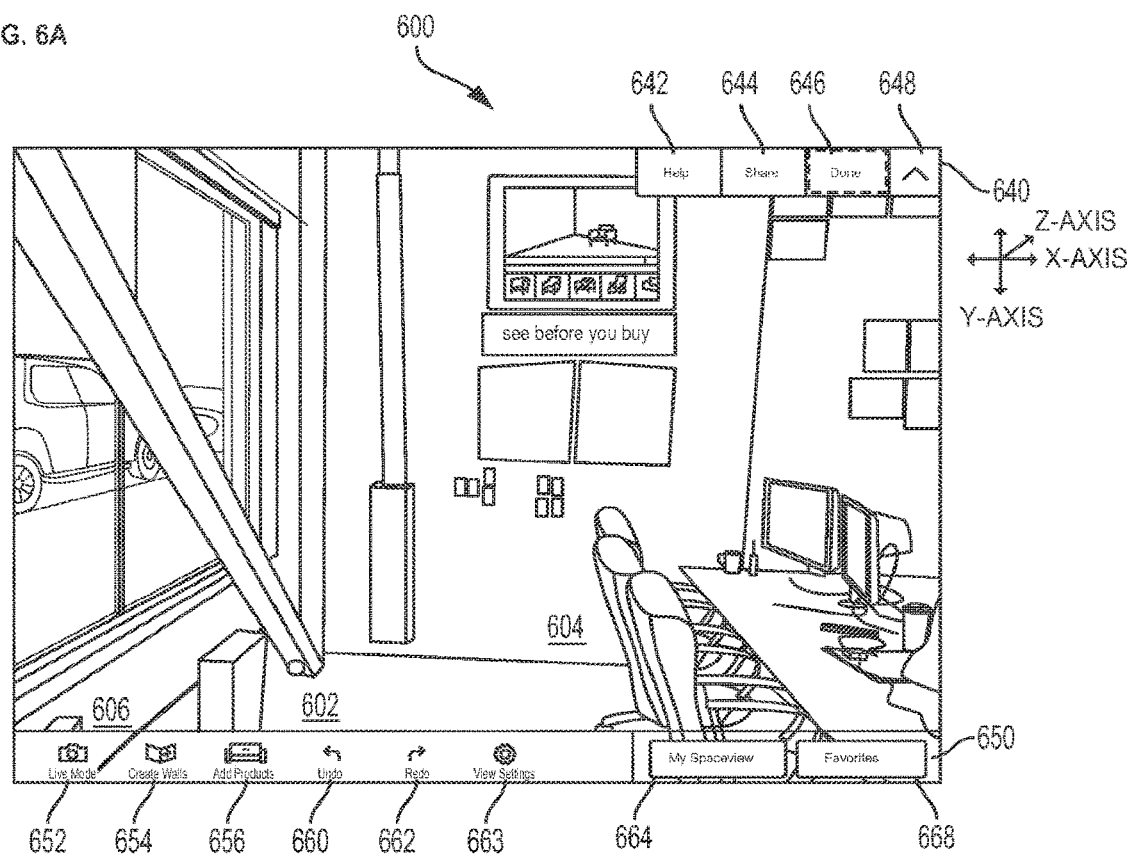
FIGS. 6A, 6B, 6C and 6D are further example representations forming a 3D model of a space corresponding to the 2D environment.
Figure 7:
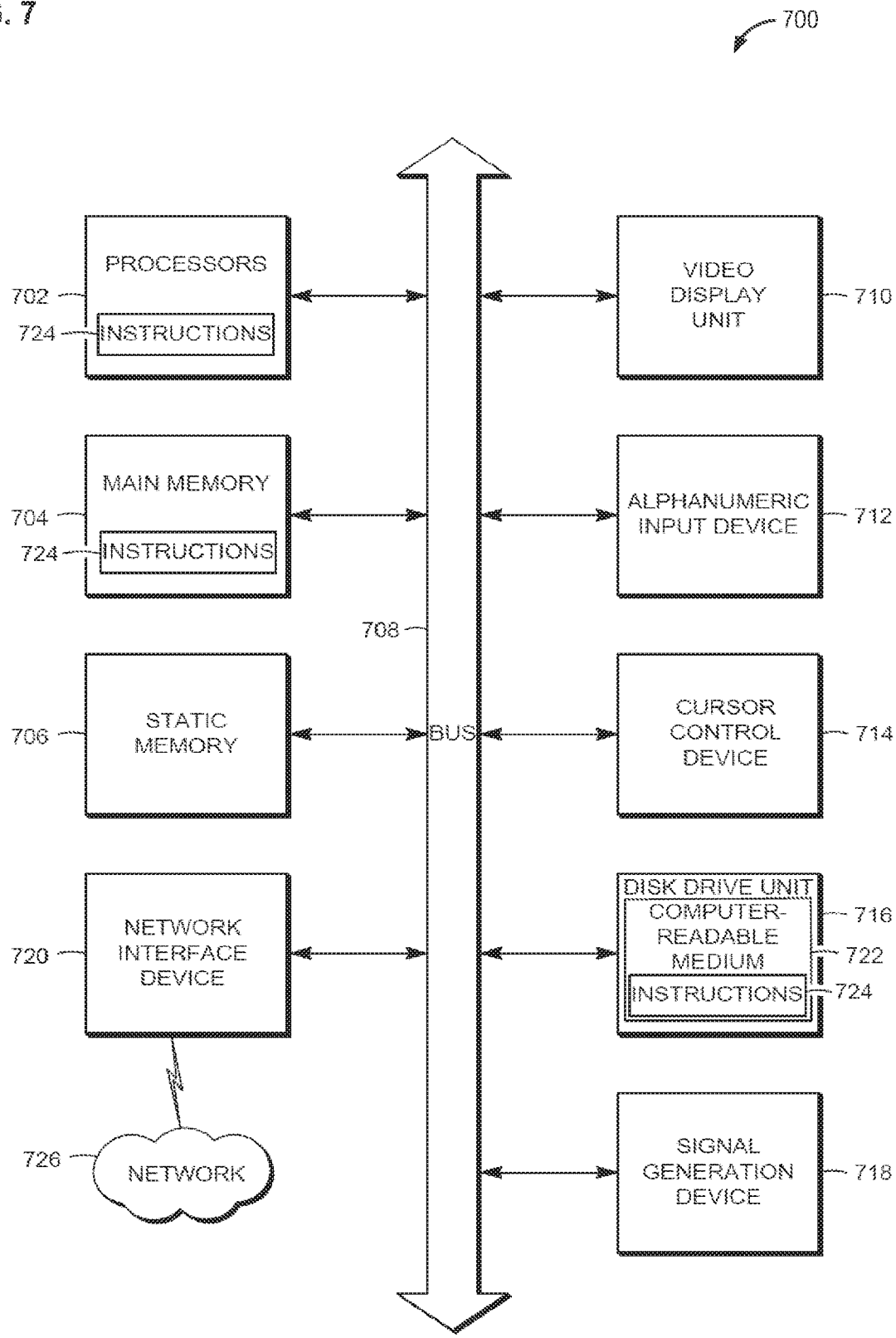
FIG. 7 illustrates an example of a computer network system, in which various embodiments may be implemented.

Further, FIG. 6A may include a menu bar 650 positioned at the bottom or lower level of the display screen. The menu bar 650 may aid a user to access various functions for customizing the 2D environment. In the example menu bar 650 shown in FIG. 6A, a first virtual button 652, a second virtual button 654, a third virtual button 656, a fourth virtual button 658, a fifth virtual button 660 and a sixth virtual button 662 are presented along the menu options in the menu bar 650. The first virtual button 652, which is labeled "Live Mode," may be selected by the user 120 to visualize a 2D environment with any of the user devices 130, discussed above. The "Live Mode" button allows the user 120 to switch between edit mode (where objects may be moved, edited and so forth) and a "live" mode where the end result is displayed.

The second virtual button 654, which is labeled "Create Walls," may be selected by the user 120 to form walls within the 2D environment. The third virtual button 656, which is labeled "Add Products," may be selected by the user 120 to add 3D objects to the 2D environment 600. These 3D objects may be obtained by the user 120 from the network 202 or from information sharing via social networking in the web applications 204. In one example, the user may select one or more 3D objects from a catalog of 3D objects from multiple vendors and 3D object sources to display in the 2D environment.

If the user decides to superimpose an additional 3D object onto the 2D environment 600, then the user may select another 3D object from a library of 3D objects. The user may access the library by clicking on or selecting the Add Products button, third virtual button 656, on the menu bar 650. The user may use one or more of the input devices of user devices 130 to access the Add Products button. The additionally selected 3D object may then be superimposed on the 2D environment 600.

The fourth virtual button 660, which is labeled "Undo," may be selected by the user 120 to undo or remove a prior modification of the selected 3D objects, or a most recent selection of the 3D object. For example, if the user 120 is not satisfied with the positioning of a 3D object with respect to the chair 610, the user 120 may undo the addition or superimposing of the 3D object onto the 2D environment 600. The fifth virtual button 662, which is labeled "Redo," may be selected by the user 120 to redo a movement of the 3D object that was recently performed. For example, the user 120 may decide to move a 3D object superimposed on the 2D environment horizontally. The user may further decide to move the 3D object, in which case the user may select the fifth virtual button 662 to "Redo" the horizontal move to repeat the previous move.

The sixth virtual icon button 663, which is labeled "View Settings," may be selected by the user 120 to review the settings of the 2D environment, in this example, 2D environment 600. For instance, the user 120 may not be satisfied with the brightness of the 2D environment 600 and hence would prefer to adjust the brightness, or the user 120 may not be satisfied with the color contrast of the room and would prefer to adjust the contrast settings. Additionally, the View Settings button 663 may provide the option of direction via a compass or a north pointing directional arrow. This may aid the user 120 in placing 3D objects in a particular preferred direction. Several users may have directional preference for placing of objects with respect to object material type and color and the directional aspect is hence very useful for such purposes.

In some embodiments, a seventh virtual button 664 may be selected by user 120 to view personalized content such as a personal 3D object library, for example, or gallery of saved 2D environments. An eight virtual button icon 668 may be selected to view favorite application content as previously identified by user 120.

Furthermore, the user 120 may save and share screenshots of the 3D object positioned in the 2D environment 600. The user may further have access to another menu bar 640. The menu bar 640 may be displayed with a virtual icon arrow 648, displayed at the top right corner in FIG. 6A. The menu bar 640 provides the user with the option to obtain help with a "Help" virtual icon button 642, or share the current image with a "Share" virtual icon button 644. The user may decide to obtain help or input from contacts in social networking groups in the web application 204 by sharing images of the 2D environment 600 with the 3D object. Further, the user may be satisfied with the placement of the 3D object in the 2D environment and may then select a virtual icon button 646 to indicate "Done" or completion or virtual button 658 in FIG. 6B.

Figure 6B:
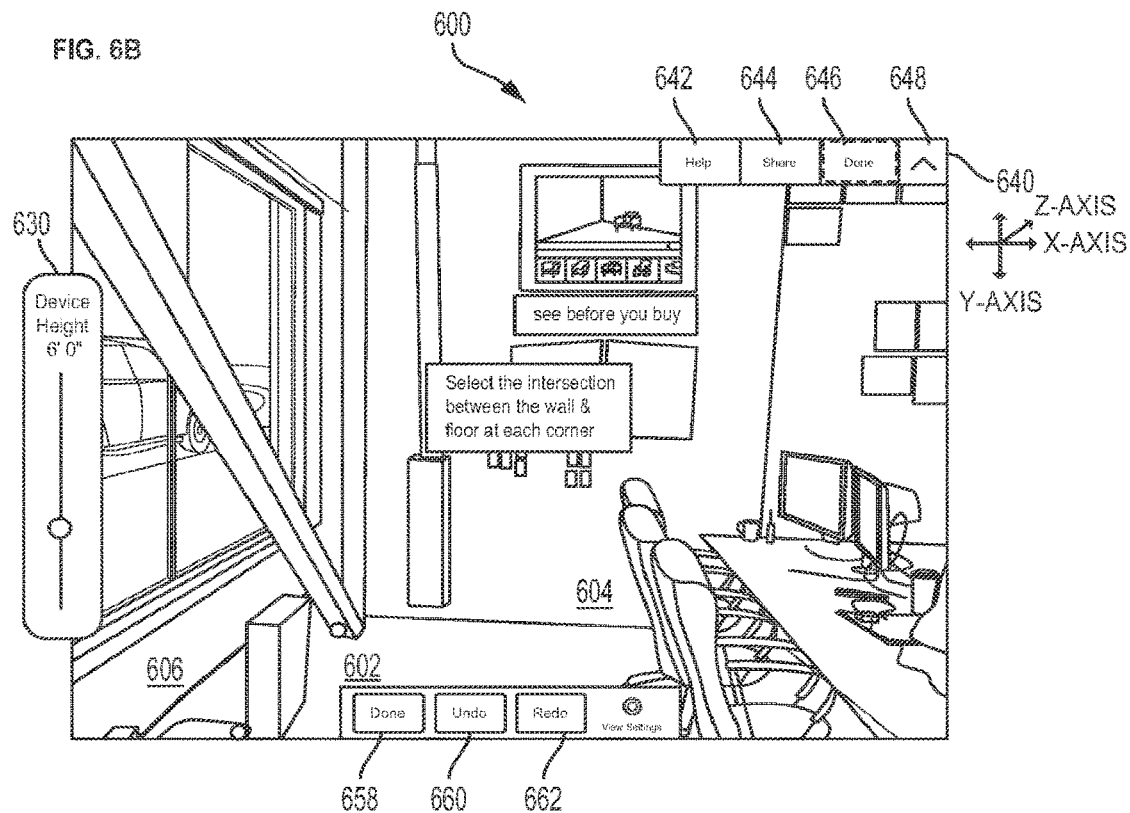
Figure 6C:
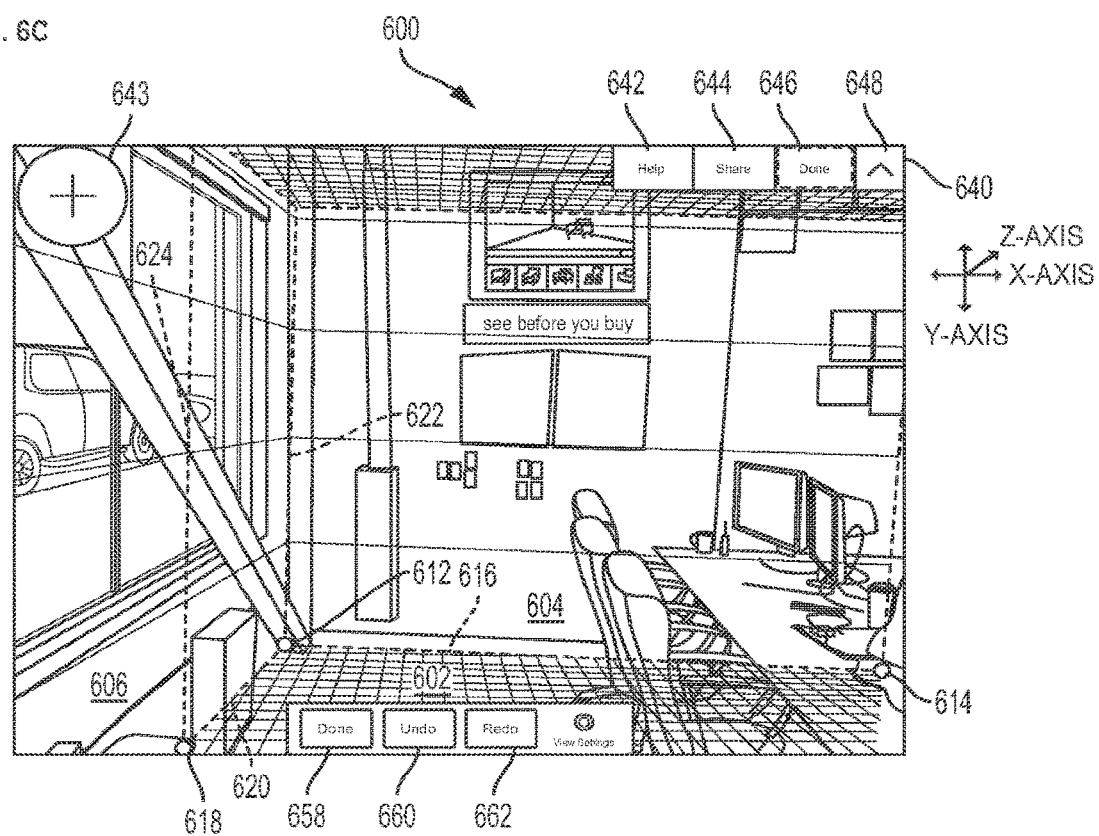

Turning to FIG. 6B, the user may decide to select the intersection points and lines between the different planes, such as the wall planes, the ground plane and the top plane. As shown in FIG. 6C, the user may select an intersection point 612 on the ground plane, between the wall plane 604, the wall plane 606 and the ground plane 602. Further, the user may select another intersection point 614 and then connect the intersection points 612 and 614 by selecting the area between intersection points 612 and 614. The user may connect the intersection points 612 and 614, by a tap or click on the area between these points. An intersecting line 616 is formed, separating the wall plane 604 from the ground plane 602. Further the user may select an intersection point 618 at the intersection of the wall plane 606 and the ground plane 602. Intersection points 612 and 618 may be connected by a line 620, such that line 620 separates the wall plane 606 from the ground plane 602. The user may further project a line 622 from the intersection point 612 towards the top plane (e.g., ceiling plane) and a line 624 from the intersection point 618 towards the top plane.

In some embodiments, the user may tap and hold any of the ground plane points such as the points, 618, 612 and 614, and move the point around for accurate alignment with the 2D environment.

Some embodiments may further include a magnifying lens icon 643. The magnifying lens icon 643 may aid the user in visualizing the plane intersection points on the ground plane.

Some embodiments may include receiving gyroscope data from the device and automatically correcting for the attitude or angle of the device when the image of the 2D environment is obtained. In other embodiments, the user may manually perform the attitude correction by providing an input through a displayed virtual icon button or slider.

Figure 6D:
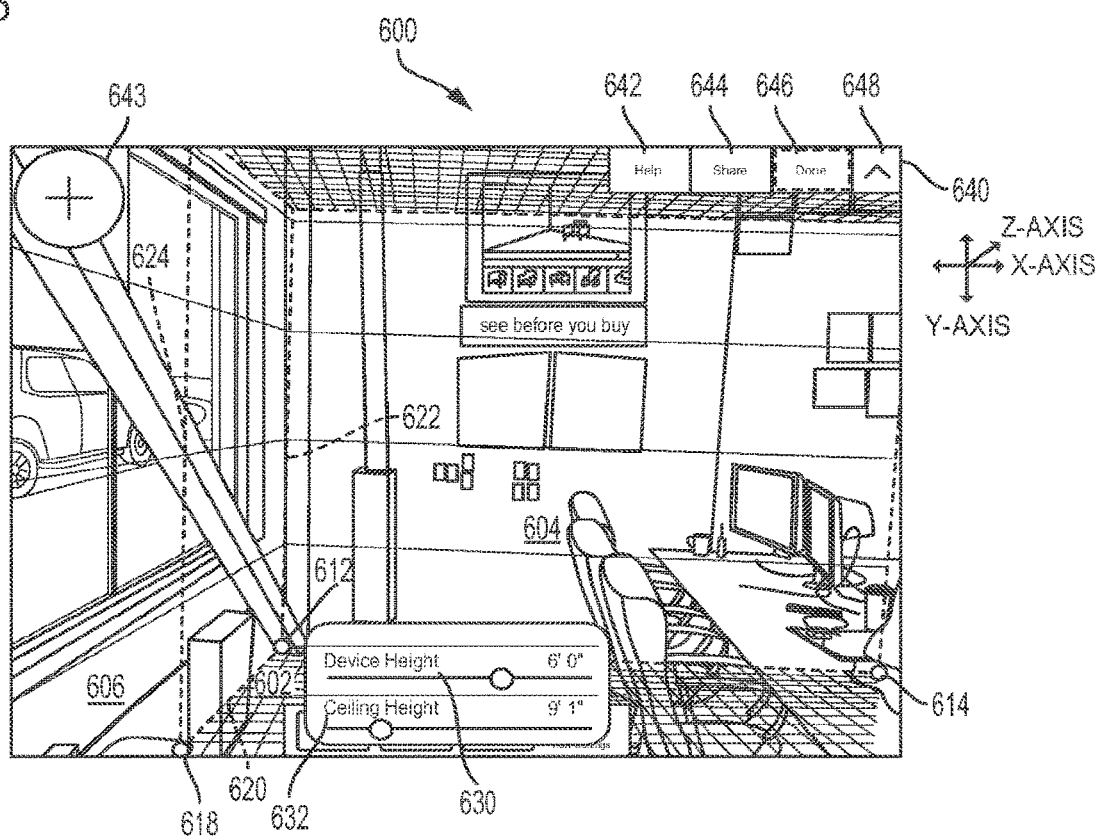

As shown in FIG. 6D, by selecting the "View Settings" button, the user may be able to select and adjust the ceiling height. In FIG. 6B, the user selects the device height, in FIG. 6C, the user adds corners and intersecting lines to define planes and in FIG. 6D, the user adjusts the ceiling height using the ceiling height menu 632. The user may also adjust the device height using the device height menu 630. As a sum of all these steps, the user is able to define a 3D space in the 2D environment 600.

FIG. 7 shows an example electronic form of a computer system 700, within which a set of instructions for causing a machine to perform any one or more of the methodologies discussed herein may be executed. The machine may be a PC, a tablet PC, a set-top box (STB), a PDA, a cellular telephone, a web appliance, a network router, switch or bridge, or any machine capable of executing a set of instructions (sequential or otherwise) that specify actions to be taken by that machine. In several example embodiments, the machine operates as a standalone device or may be connected to other machines (e.g., networked). In a networked disposition, the machine may operate in the capacity of a server or a client machine in a server-client network environment.

The example computer system 700 may be configured to include a processor or multiple processors 702 (e.g., a central processing unit (CPU), a graphics processing unit (GPU), or both), a main memory 704 and a static memory 706, which communicate with each other via a bus 708. The computer system may further include a video display unit 710 (e.g., a liquid crystal display (LCD) or a cathode ray tube (CRT), and the like). The computer system 700 may also include an alphanumeric input device 712 (e.g., a keyboard, and the like), a cursor control device 714 (e.g., a mouse, touchpad, touchscreen, and the like), a disk drive unit 716 for reading computer readable medium (e.g., USB thumb drive, solid state memory drives, and the like), a signal generation device 718 (e.g., a speaker, and the like (e.g., network interface card, and the like), and a network interface device 720.

Further, the disk drive unit 716 may include a computer-readable medium 722, on which is stored one or more sets of instructions and data structures (such as instructions 724) embodying or utilized by any one or more of the methodologies or functions described herein. Additionally, the instructions 724 may also reside, completely or partially, within the main memory 704 and/or within the processors 702 during execution by the computer system 700. The main memory 704 and the processors 702 may also constitute machine-readable media. Further still, the instructions 724 may be transmitted or received over a network 726 via the network interface device 720 utilizing any one of a number of well-known transfer protocols (e.g., Hyper Text Transfer Protocol (HTTP)).

The computer-readable medium 722 may include a single medium or multiple media (e.g., a centralized or distributed database and/or associated caches and servers) that store the one or more sets of instructions. The term "computer-readable medium" may further include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. Further, "computer-readable medium" may further include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like.

It will be appreciated that the configurations and routines disclosed herein are exemplary in nature, and that these specific embodiments are not to be considered in a limiting sense, because numerous variations are possible. For example, the above technology can be applied to various 3D objects superimposed on various 2D environments. The subject matter of the present disclosure includes all novel and non-obvious combinations and sub-combinations of the various systems and configurations, and other features, functions, and/or properties disclosed herein.

The above-disclosed embodiments may be combined with one or more of the embodiments and disclosures in U.S. Provisional Patent Application No. 61/992,629 entitled "METHOD FOR PROVIDING SCALE TO ALIGN 3D OBJECTS IN 2D ENVIRONMENT" filed May 13, 2014, one or more of the embodiments and disclosures in U.S. Provisional Patent Application No. 61/992,719 entitled "METHOD FOR PROVIDING A PROJECTION TO ALIGN 3D OBJECTS IN 2D ENVIRONMENT", filed May 13, 2014, one or more of the embodiments and disclosures in U.S. Provisional Patent Application No. 61/992,774 entitled "METHOD FOR MOVING AND ALIGNING 3D OBJECTS IN A PLANE WITHIN THE 2D ENVIRONMENT", filed May 13, 2014, one or more of the embodiments and disclosures in U.S. Provisional Patent Application No. 61/992,746 entitled "METHOD FOR REPLACING 3D OBJECTS IN 2D ENVIRONMENT", filed May 13, 2014, and/or one or more of the embodiments and disclosures in U.S. Provisional Patent Application No. 61/992,665 entitled "METHOD FOR INTERACTIVE CATALOG FOR 3D OBJECTS WITHIN THE 2D ENVIRONMENT", filed May 13, 2014. The entire contents of each provisional application referenced herein are hereby incorporated by reference for all purposes. For example, and not as a limitation, the embodiments herein may be combined with the elements and features disclosed in Provisional Application No. 61/992,629, in combination with one or more of the elements and features disclosed in Provisional Application No. 61/992,719, in combination with one or more of the elements and features disclosed in Provisional Application No. 61/992,774, in combination with one or more of the elements and features disclosed in Provisional Application No. 61/992,746, and/or in combination with one or more of the elements and features disclosed in Provisional Application No. 61/992,665. These combinations may include one or more features disclosed in one or more of the referenced provisional applications, including combinations of embodiments disclosed herein with features shown in one, two, three, four, or five of the provisional applications.

Further, the entire contents of each concurrently filed application, U.S. Non-Provisional patent application Ser. No. 14/710,554 entitled "METHOD FOR PROVIDING SCALE TO ALIGN 3D OBJECTS IN 2D ENVIRONMENT" filed May 12, 2015, U.S. Non-Provisional patent application Ser. No. 14/710,560 entitled "METHOD FOR PROVIDING A PROJECTION TO ALIGN 3D OBJECTS IN 2D ENVIRONMENT", filed May 12, 2015, U.S. Non-Provisional patent application Ser. No. 14/710,561 entitled "METHOD FOR MOVING AND ALIGNING 3D OBJECTS IN A PLANE WITHIN THE 2D ENVIRONMENT", filed May 12, 2015, U.S. Non-Provisional patent application Ser. No. 14/710,565 entitled "METHOD FOR REPLACING 3D OBJECTS IN 2D ENVIRONMENT", filed May 12, 2015, and/or U.S. Non-Provisional patent application Ser. No. 14/710,569 entitled "METHOD FOR INTERACTIVE CATALOG FOR 3D OBJECTS WITHIN THE 2D ENVIRONMENT", filed May 12, 2015, referenced herein are hereby incorporated by reference for all purposes.

The foregoing description is illustrative of particular embodiments of the invention, but is not meant to be a limitation upon the practice thereof.

The foregoing discussion should be understood as illustrative and should not be considered limiting in any sense. While the inventions have been particularly shown and described with references to preferred embodiments thereof, it will be understood by those skilled in the art that various changes in form and details may be made therein without departing from the spirit and scope of the inventions as defined by the claims.

The corresponding structures, materials, acts and equivalents of all means or steps plus function elements in the claims below are intended to include any structure, material or acts for performing the functions in combination with other claimed elements as specifically claimed.

Finally, it will be understood that the articles, systems, and methods described hereinabove are embodiments of this disclosure—non-limiting examples for which numerous variations and extensions are contemplated as well. Accordingly, this disclosure includes all novel and non-obvious combinations and sub-combinations of the articles, systems, and methods disclosed herein, as well as any and all equivalents thereof.

The invention claimed is:

1. A method, comprising:
   receiving, at a processing device coupled to a display device, two-dimensional environment data that corresponds to an image of a real environment;
   generating, by the processing device, three-dimensional environment data based on the two-dimensional environment data, the three-dimensional environment data corresponding to a three-dimensional model of the real environment;
   determining, by the processing device, environmental parameter data that corresponds to a first rule for placement or orientation of a real object in the real environment based on a feature of the real environment, the feature of the real environment corresponding to:
      a placement or orientation of other objects in the real environment based on the two-dimensional environment data;
      a practical standard for usability of the real environment;
      an access regulation established by a government or regulatory authority; or
      a safety standard established by the government or regulatory authority;
   determining, by the processing device, object parameter data that corresponds to a second rule for placement or orientation of the real object in the real environment based on a feature of the real object, the feature of the real object corresponding to:
      a spatial standard that exceeds a geometric dimension of the real object; or
      a proximity standard for placement of the real object within a maximum proximity of another feature of the real environment;
   receiving, by the processing device, input data that corresponds to placement of a three-dimensional object in the three-dimensional environment, the three-dimensional object being a virtual rendering of the real object; and
   in response to receiving the input data, displaying, by a display device coupled to the processing device, the three-dimensional environment with the three-dimensional object, wherein the three-dimensional object is displayed in the three-dimensional environment according to the environment parameter data and the object parameter data.

2. The method of claim 1, wherein the feature of the real environment further corresponds to a minimum clearance around the other objects in the real environment.

3. The method of claim 1, wherein the feature of the real environment further corresponds to maintaining a pathway for traversal of the real environment.

4. The method of claim 1, wherein the feature of the real environment further corresponds to a retail merchandising plan.

5. The method of claim 1, further comprising:
receiving, by the processing device, safety or regulation data, the safety or regulation data received via manual input by a user or from a regulatory database, the safety or regulation data corresponding to:
an access regulation; or
a fire code; and
determine the environmental parameter data based on the safety or regulation data.

6. The method of claim 1, further comprising:
receiving, by the processing device, manufacturer data that corresponds to a manufacturer specification for the real object, the manufacturing data received via manual input by a user or from a manufacturer database; and
determining the object parameter data based on the manufacturer data.

7. The method of claim 1, wherein the other feature corresponding to the proximity standard comprises:
an electrical panel; or
an air vent.

8. A method, comprising:
receiving, at a processing device coupled to a display device, two-dimensional environment data that corresponds to an image of a real environment;
generating, by the processing device, three-dimensional environment data based on the two-dimensional environment data, the three-dimensional environment data corresponding to a three-dimensional model of the real environment;
determining, by the processing device, environmental parameter data that corresponds to a first rule for placement or orientation of a real object in the real environment based on a feature of the real environment other than an architectural feature of the real environment;
determining, by the processing device, object parameter data that corresponds to a second rule for placement or orientation of the real object in the real environment based on a feature of the real object other than a geometric dimension of the real object;
receiving, by the processing device, input data that corresponds to placement of a three-dimensional object in the three-dimensional environment, the three-dimensional object being a virtual rendering of the real object; and
in response to receiving the input data, displaying, by a display device coupled to the processing device, the three-dimensional environment with the three-dimensional object, wherein the three-dimensional object is displayed in the three-dimensional environment according to the environment parameter data and the object parameter data.

9. The method of claim 8, wherein the environmental parameter data corresponds to:
a placement or orientation of another object in the real environment; and
a minimum or maximum spacing in the real environment between the real object and the other object, the spacing corresponding to a rule for traversal of the real environment.

10. The method of claim 8, wherein the environmental parameter data corresponds to a rule established by a government or regulatory authority.

11. The method of claim 8, wherein the object parameter data corresponds to a spatial standard for a minimum amount of clearance around the real object.

12. The method of claim 8, wherein the object parameter data corresponds to a proximity standard for placement of the real object within a maximum proximity of:
an electrical panel;
an air vent; or
an architectural feature of the real environment.

13. The method of claim 8, wherein the real environment is:
an industrial environment and the environmental parameter data is based on occupational safety and health regulations;
a retail environment and the environmental parameter data is based on a merchandising plan for the retail environment; or
a restaurant environment and the environmental parameter data is based on a traversal plan for the restaurant environment.

14. The method of claim 8, wherein the object parameter data is based on an interaction between the real object and another object in the real environment.

15. A method, comprising:
receiving, at a processing device, two-dimensional environment data that corresponds to a digital image of a real environment;
generating, by the processing device, three-dimensional environment data based on the two-dimensional environment data, the three-dimensional environment data corresponding to a three-dimensional model of the real environment;
determining, by the processing device, parameter data that corresponds to a parameter for placing a three-dimensional object in a three-dimensional environment defined by the three-dimensional environment data, wherein the parameter defines a limitation on position or orientation of a real object in the real environment, the three-dimensional object being a virtual model of a real object;
receiving, by the processing device, input data that corresponds to placing a three-dimensional object in the three-dimensional environment, the three-dimensional object being a virtual rendering of the real object;
in response to receiving the input data, displaying, by a display device coupled to the processing device, the three-dimensional environment with the three-dimensional object, wherein the three-dimensional object is displayed in the three-dimensional environment according to the parameter data; and
in response to receiving the input data, altering, by the processing device for display by the display device, a brightness or a contrast of an element of the three-dimensional environment, wherein altering the brightness or the contrast is further in response to the input data indicating a position of the three-dimensional object in the three-dimensional environment:
violates a rule associated with the parameter data for placement of the real object in the real environment; or
is permissible under the rule associated with the parameter data for placement of the real object in the real environment.

16. The method of claim 15, wherein the parameter data is environmental parameter data or object parameter data.

17. The method of claim 16, wherein the environmental parameter data corresponds to:
- a rule established by a government or regulatory authority; or
- a layout for other objects in the real environment.

18. The method of claim 16, wherein the object parameter data corresponds to:
- a minimum clearance around the real object as established by a manufacturer or safety specification; or
- a minimum or maximum proximity for the real object to another object in the real environment.

19. The method of claim 15, further comprising, in response to receiving the input data, altering, by the processing device for display by the display device, a brightness or a contrast of the three-dimensional object, wherein altering the brightness or the contrast is further in response to the input data indicating a position of the three-dimensional object in the three-dimensional environment:
- violates a rule associated with the parameter data for placement of the real object in the real environment; or
- is permissible under the rule associated with the parameter data for placement of the real object in the real environment.

* * * * *